(12) United States Patent
Choi et al.

(10) Patent No.: US 10,672,792 B2
(45) Date of Patent: Jun. 2, 2020

(54) THREE-DIMENSIONAL SEMICONDUCTOR MEMORY DEVICE

(71) Applicant: Samsung Electronics Co., Ltd., Suwon-si, Gyeonggi-do (KR)

(72) Inventors: Kangyoon Choi, Seoul (KR); Gilsung Lee, Seoul (KR); Dong-Sik Lee, Hwaseong-si (KR); Yongsik Yim, Seongnam-si (KR); Eunsuk Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/266,409

(22) Filed: Feb. 4, 2019

(65) Prior Publication Data

US 2019/0371808 A1    Dec. 5, 2019

(30) Foreign Application Priority Data

May 31, 2018  (KR) .................... 10-2018-0062931

(51) Int. Cl.
| | | |
|---|---|---|
| H01L 29/792 | (2006.01) | |
| H01L 27/11582 | (2017.01) | |
| H01L 27/1157 | (2017.01) | |
| H01L 27/11565 | (2017.01) | |
| H01L 21/28 | (2006.01) | |

(52) U.S. Cl.
CPC .... *H01L 27/11582* (2013.01); *H01L 27/1157* (2013.01); *H01L 27/11565* (2013.01); *H01L 29/40117* (2019.08)

(58) Field of Classification Search
CPC ......... H01L 21/31144; H01L 27/11573; H01L 27/11565; H01L 27/1157; H01L 27/11582; H01L 29/40117
USPC ....................................... 257/324
See application file for complete search history.

(56) References Cited

U.S. PATENT DOCUMENTS

| | | | |
|---|---|---|---|
| 8,274,108 | B2 | 9/2012 | Katsumata et al. |
| 9,362,305 | B2 | 6/2016 | Oh et al. |
| 9,368,645 | B2 | 6/2016 | Kim et al. |
| 9,502,432 | B1 | 11/2016 | Shin |
| 9,620,512 | B1 | 4/2017 | Nishikawa et al. |
| 9,627,076 | B2 | 4/2017 | Nam |
| 9,755,085 | B2 | 9/2017 | Lee et al. |
| 2017/0186489 | A1 | 6/2017 | Kim |
| 2018/0151672 | A1* | 5/2018 | Choi ................. H01L 27/11524 |

(Continued)

*Primary Examiner* — David S Blum
(74) *Attorney, Agent, or Firm* — Harness, Dickey & Pierce, P.L.C.

(57) ABSTRACT

Provided is a three-dimensional semiconductor memory device include a first stack structure and a second stack structure adjacent to each other on a substrate, a first common source plug between the first stack structure and the second stack structure, a second common source plug between the first stack structure and the second stack structure, and a vertical dielectric structure between the first common source plug and the second common source plug. Each of the first stack structure and the second stack structure may include a plurality of insulation layers and a plurality of electrodes alternately stacked on the substrate. The first common source plug may be connected to the substrate. The second common source plug may be spaced apart from the substrate.

20 Claims, 43 Drawing Sheets

(56) References Cited

U.S. PATENT DOCUMENTS

2018/0240811 A1\* 8/2018 Kim ................ H01L 27/11565
2019/0288001 A1\* 9/2019 Yu .................... H01L 27/11568

\* cited by examiner

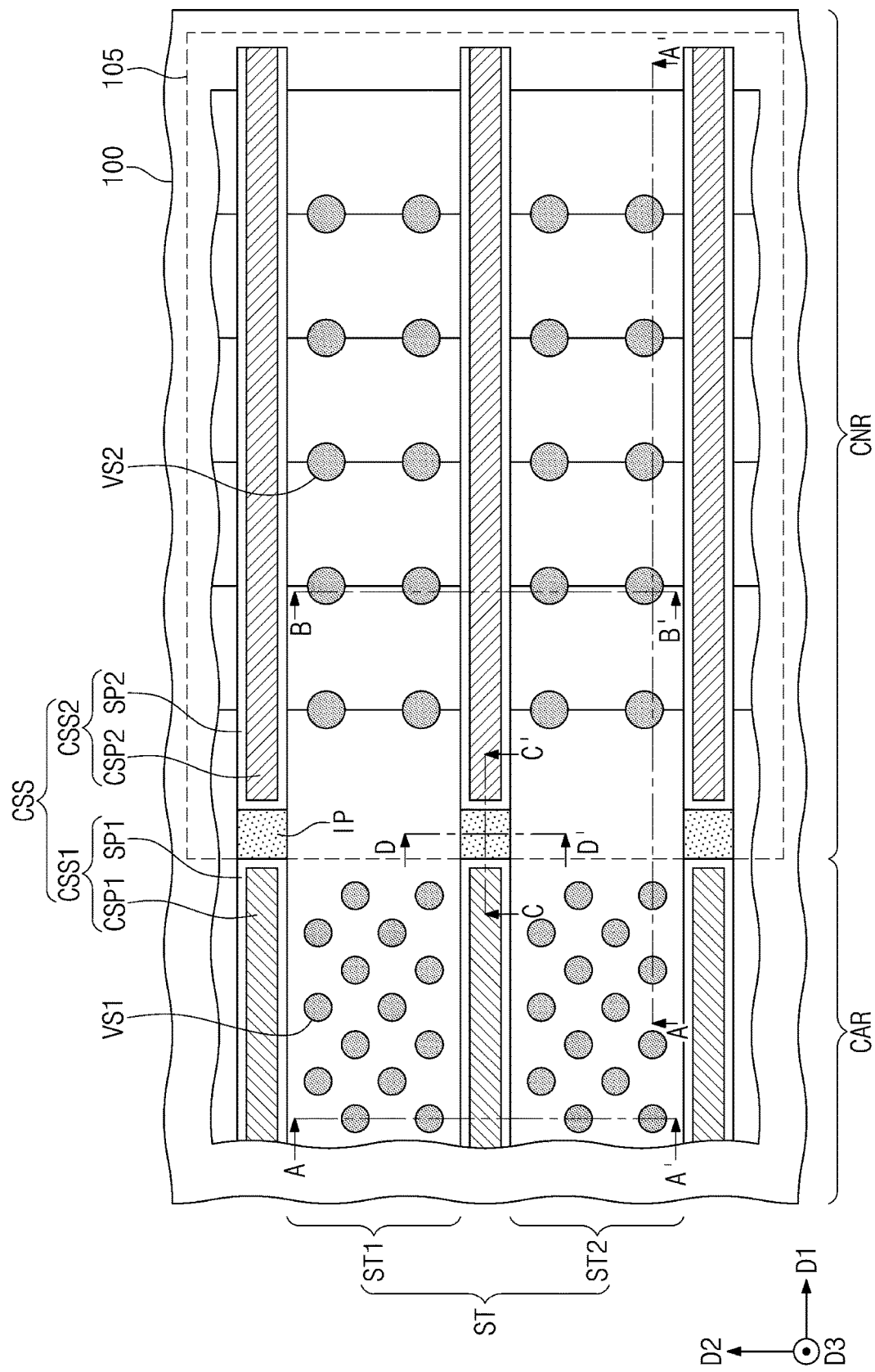

THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2018-0062931 filed on May 31, 2018 in the Korean Intellectual Property Office, the entire contents of which are hereby incorporated by reference.

BACKGROUND

Inventive concepts relate to a three-dimensional semiconductor memory device, and more particularly, to a three-dimensional semiconductor memory device with increased reliability and integration.

Semiconductor devices have been highly integrated to meet high performance and low manufacturing costs, which are desired by customers. Because integration of the semiconductor devices is an important factor in determining product price, high integration is increasingly requested. Integration of typical two-dimensional or planar semiconductor memory devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor memory devices. Therefore, there have been proposed three-dimensional semiconductor memory devices having three-dimensionally arranged memory cells.

SUMMARY

Some example embodiments of inventive concepts provide a three-dimensional semiconductor memory device with increased reliability and integration.

Features of inventive concepts are not limited to the mentioned above, and other features which have not been mentioned above will be clearly understood to those skilled in the art from the following description.

According to some example embodiments of inventive concepts, a three-dimensional semiconductor memory device may include a substrate, a first stack structure and a second stack structure adjacent to each other on the substrate, a first common source plug between the first stack structure and the second stack structure, a second common source plug between the first stack structure and the second stack structure, and a vertical dielectric structure between the first common source plug and the second common source plugs. Each of the first stack structure and the second stack structure may include a plurality of insulation layers and a plurality of electrodes alternately stacked on the substrate. The first common source plug may be connected to the substrate. The second common source plug may be spaced apart from the substrate.

According to some example embodiments of inventive concepts, a three-dimensional semiconductor memory device may include a substrate, a dielectric pattern in the substrate, a stack structure on the substrate, a plurality of vertical channels penetrating the stack structure, a first common source plug between the plurality of vertical channel structure, a plurality of contact plugs connected to the plurality of electrodes, and a second common source plug. The stack structure may include a plurality of insulation layers and a plurality of electrodes alternately stacked on the substrate. The second common source plug may be insulated from the first common source plug and between the plurality of contact plugs. The first common source plug may be connected to the substrate. The second common source plug may be spaced apart from the substrate across the dielectric pattern.

According to some example embodiments of inventive concepts, a three-dimensional semiconductor memory device may include a substrate including a cell array region and a connection region, the substrate having a trench on the connection region; a dielectric pattern filling the trench; a stack structure on the cell array region and the connection region, the stack structure including a plurality of insulation layers and a plurality of electrodes alternately stacked; a vertical channel structure on the cell array region of the substrate and penetrating the stack structure on the cell array region and being connected to the substrate; a contact plug, the connect plug being connected to the connection region of the substrate; a first common source plug on the cell array region of the substrate, the first common source plug on a side of the stack structure; and a second common source plug on the connection region of the substrate, the second common source plug on a side of the stack structure. The first common source plug may be connected to the substrate. The second common source plug may be spaced apart from the substrate across the dielectric pattern.

Details of other example embodiments are included in the description and drawings.

BRIEF DESCRIPTION OF THE DRAWINGS

FIGS. 12A, 13A, 14A, 15A, and 16A illustrate plan views showing a method of manufacturing a three-dimensional semiconductor memory device, according to some example embodiments of inventive concepts.

DETAILED DESCRIPTION OF EMBODIMENTS

Some example embodiments of inventive concepts will be described below in detail in conjunction with the accompanying drawings.

Figure 1:
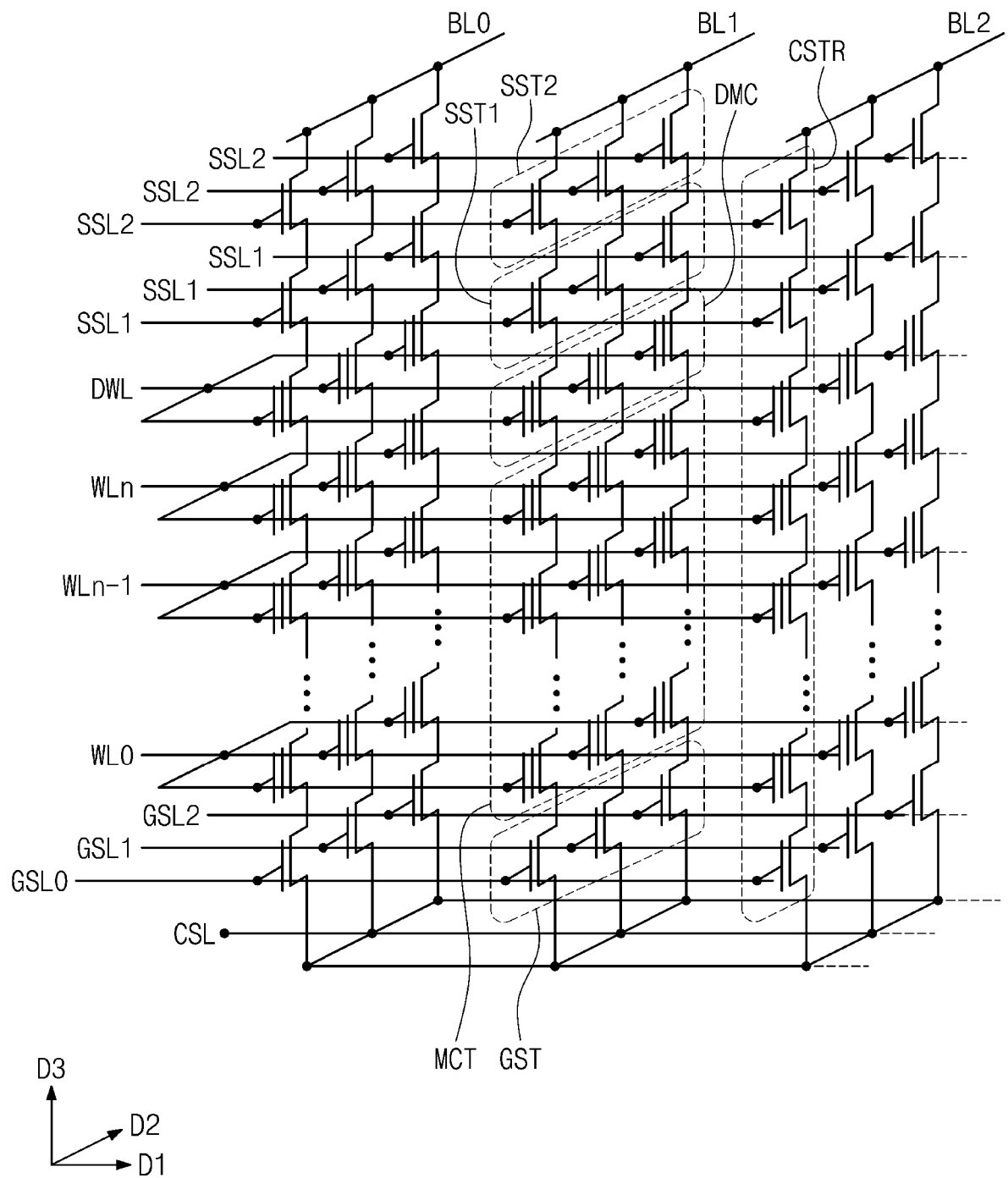
FIG. 1 illustrates a simplified circuit diagram showing a cell array of a three-dimensional semiconductor memory device according to some example embodiments of inventive concepts.

FIG. 1 illustrates a simplified circuit diagram showing a cell array of a three-dimensional semiconductor memory device according to some example embodiments of inventive concepts.

Referring to FIG. 1, a cell array of a three-dimensional semiconductor memory device according to some example embodiments of inventive concepts may include a common source line CSL, a plurality of bit lines BL0 to BL2, and a plurality of cell strings CSTR between the common source line CSL and the bit lines BL0 to BL2.

The cell strings CSTR may extend in a third direction D3 on a plane elongated along first and second directions D1 and D2. The bit lines BL0 to BL2 may be spaced apart from each other in the first direction D1, while extending in the second direction D2.

A plurality of cell strings CSTR may be connected in parallel to each of the bit lines BL0 to BL2. The plurality of cell strings CSTR may be connected in common to the common source line CSL. For example, the plurality of cell strings CSTR may be disposed between a plurality of bit lines BL0 to BL2 and one common source line CSL. The common source line CSL may be provided in plural, and the plurality of common source lines CSL may be arranged two-dimensionally. The common source lines CSL may be supplied with the same voltage or electrically controlled independently of each other.

In some example embodiments, each of the cell strings CSTR may include string select transistors SST1 and SST2 connected in series, memory cell transistors MCT connected in series, and a ground select transistor GST. Each of the memory cell transistors MCT may include a data storage element.

For example, each of the cell strings CSTR may include first and second string select transistors SST1 and SST2 connected in series, the second string select transistor SST2 may be coupled to one of the bit lines BL0 to BL2, and the ground select transistor GST may be coupled to the common source line CSL. The memory cell transistors MCT may be connected in series between the first string select transistor SST1 and the ground select transistor GST.

Each of the cell strings CSTR may further include a dummy cell transistor DMC connected between the first string select transistor SST1 and the memory cell transistor MCT. Although not shown in figures, the dummy cell transistor DMC may also be connected between the ground select transistor GST and the memory cell transistor MCT. For another example, in each of the cell strings CSTR, the ground select transistor GST may include a plurality of MOS transistors connected in series similar to the first and second string select transistors SST1 and SST2. For another example, each of the cell strings CSTR may include a single string select transistor.

In some example embodiments, the first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cell transistor DMC may be controlled by a dummy word line DWL. The ground select transistor GST may be controlled by one of ground select lines GSL0 to GLS2. The common source line CSL may be connected in common to sources of the ground select transistors GST.

The memory cell transistors MCT may include gate electrodes, which are located at substantially the same distance from the common source lines CSL, connected in common to one of the word lines WL0 to WLn and DWL, which may result that the gate electrodes may have an equipotential state. Alternatively, although the gate electrodes of the memory cell transistors MCT are located at substantially the same distance from the common source lines CSL, the gate electrodes disposed at different rows or columns may be controlled independently of each other.

The ground select lines GSL0 to GSL2 and the string select lines SSL1 and SSL2 may extend along the first direction D1 and may be spaced apart from each other in the second direction D2. The ground select lines GSL0 to GSL2 may be located at substantially the same level from the common source lines CSL and may be electrically separated from each other, and the same may be true of the string select lines SSL1 and SSL2.

Figure 2:
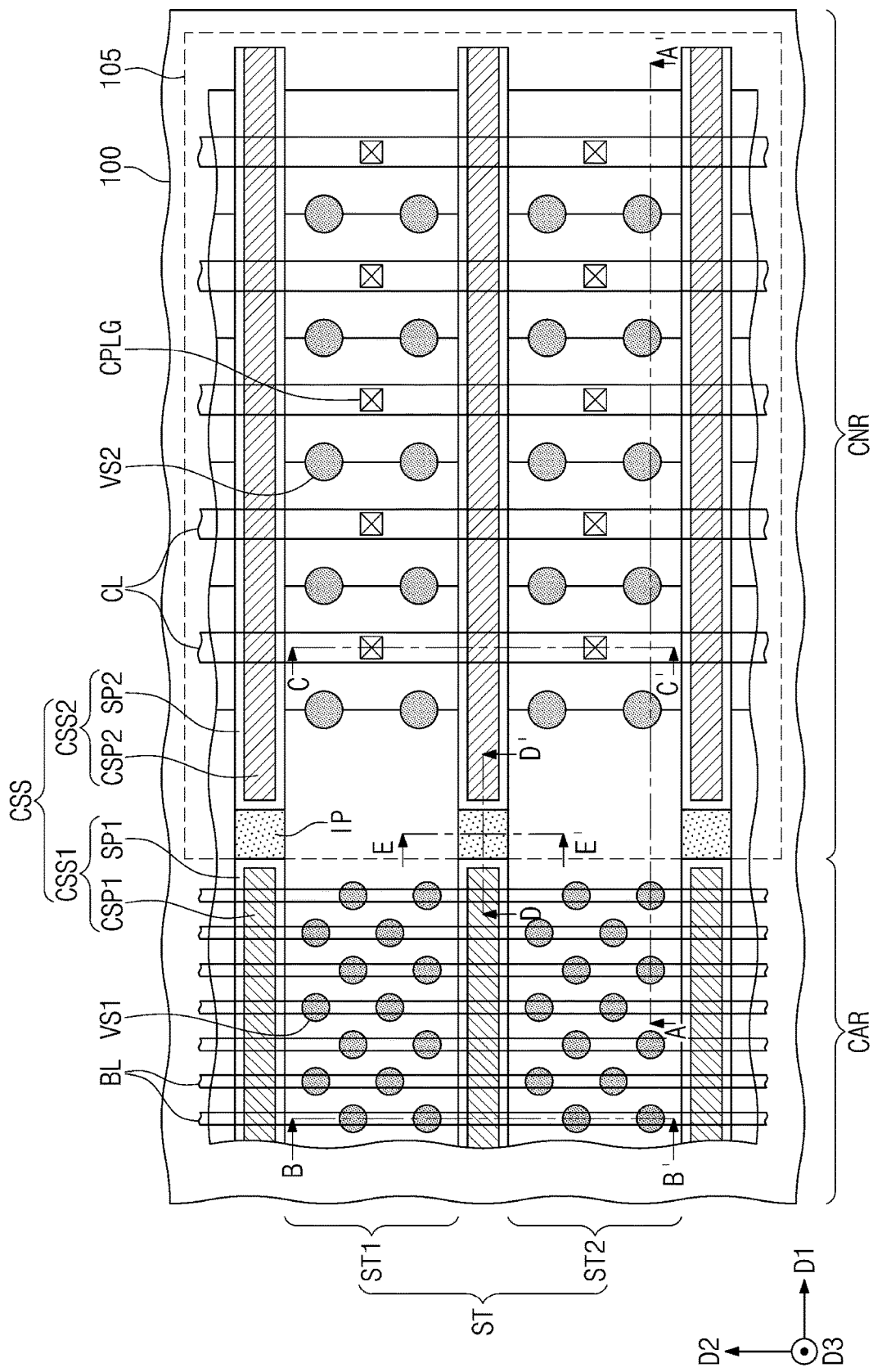
FIG. 2 illustrates a plan view showing a three-dimensional semiconductor memory device according to some example embodiments of inventive concepts.
Figure 3A:
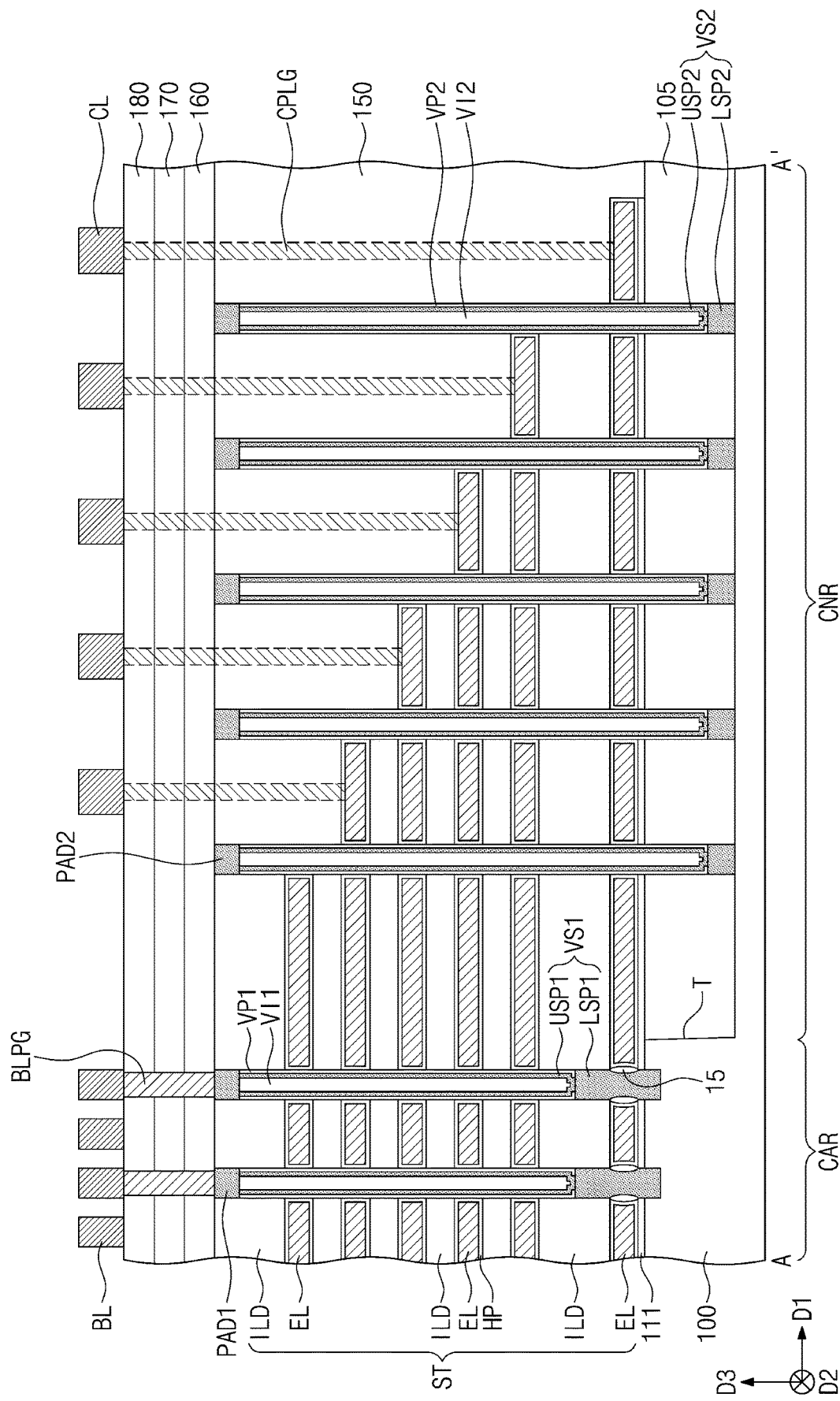
FIGS. 3A, 3B, and 3C illustrate cross-sectional views respectively taken along lines A-A', B-B', and C-C' of FIG. 2, showing a three-dimensional semiconductor memory device according to some example embodiments of inventive concepts.
Figure 3B:
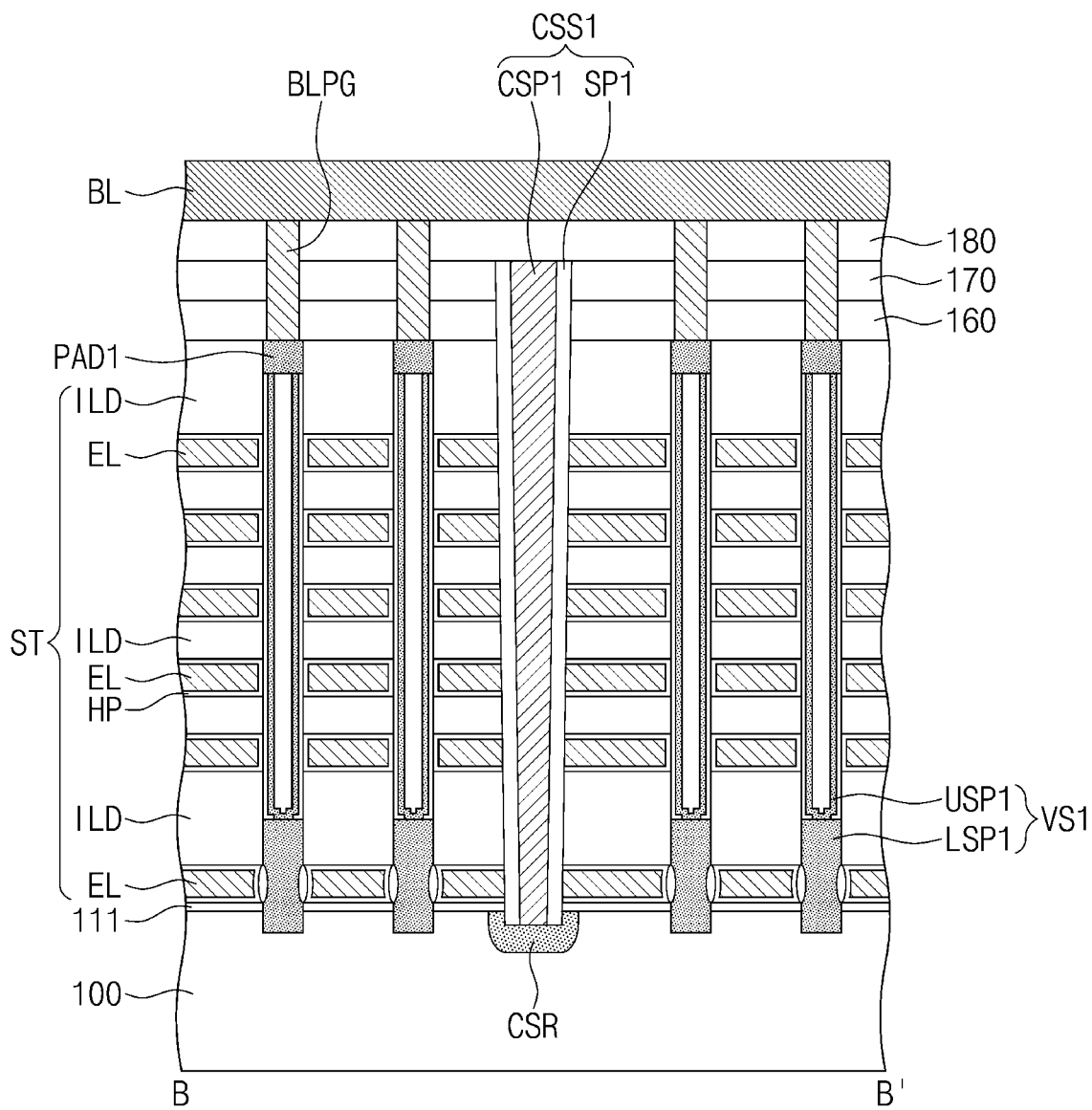
Figure 3C:
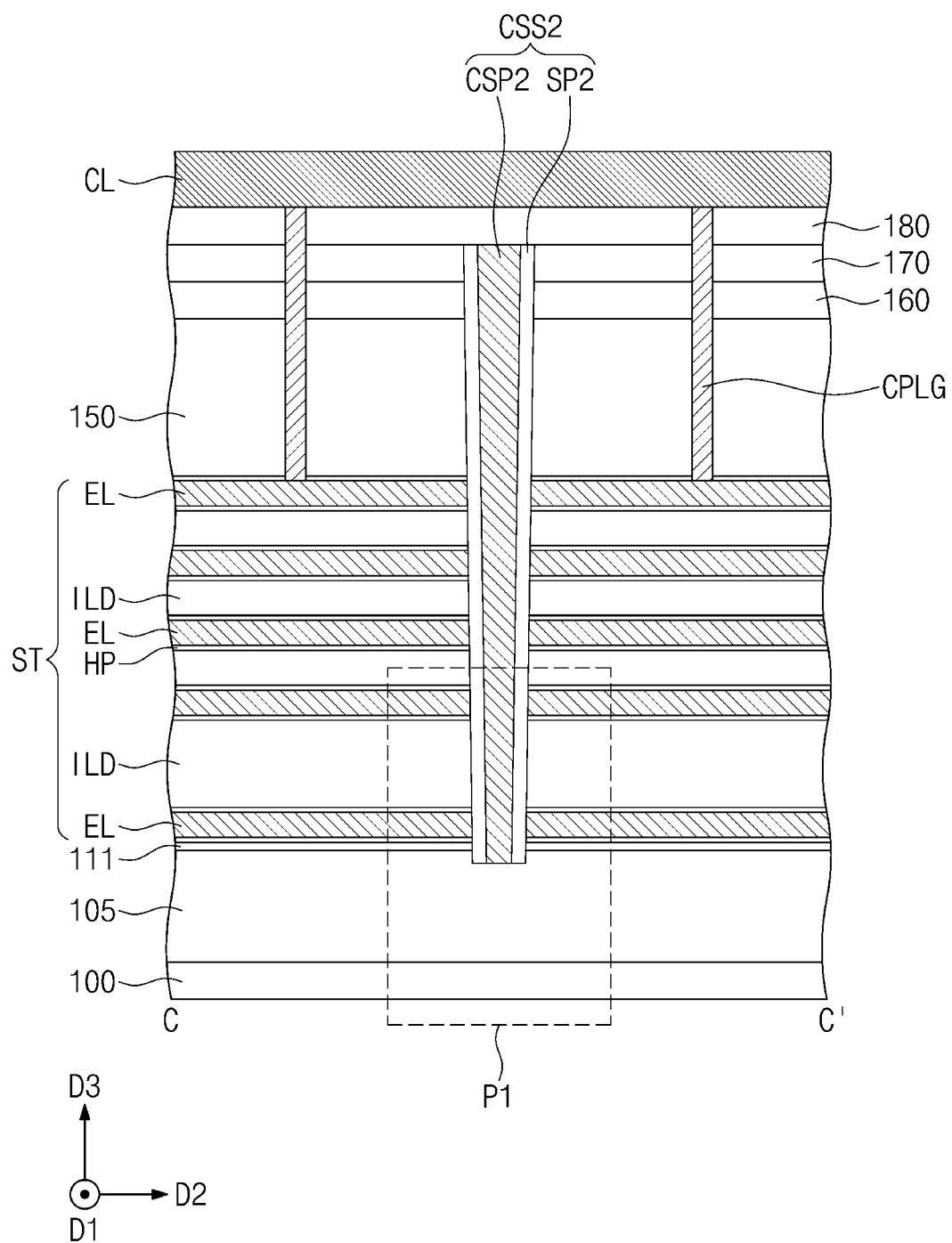
Figure 3D:
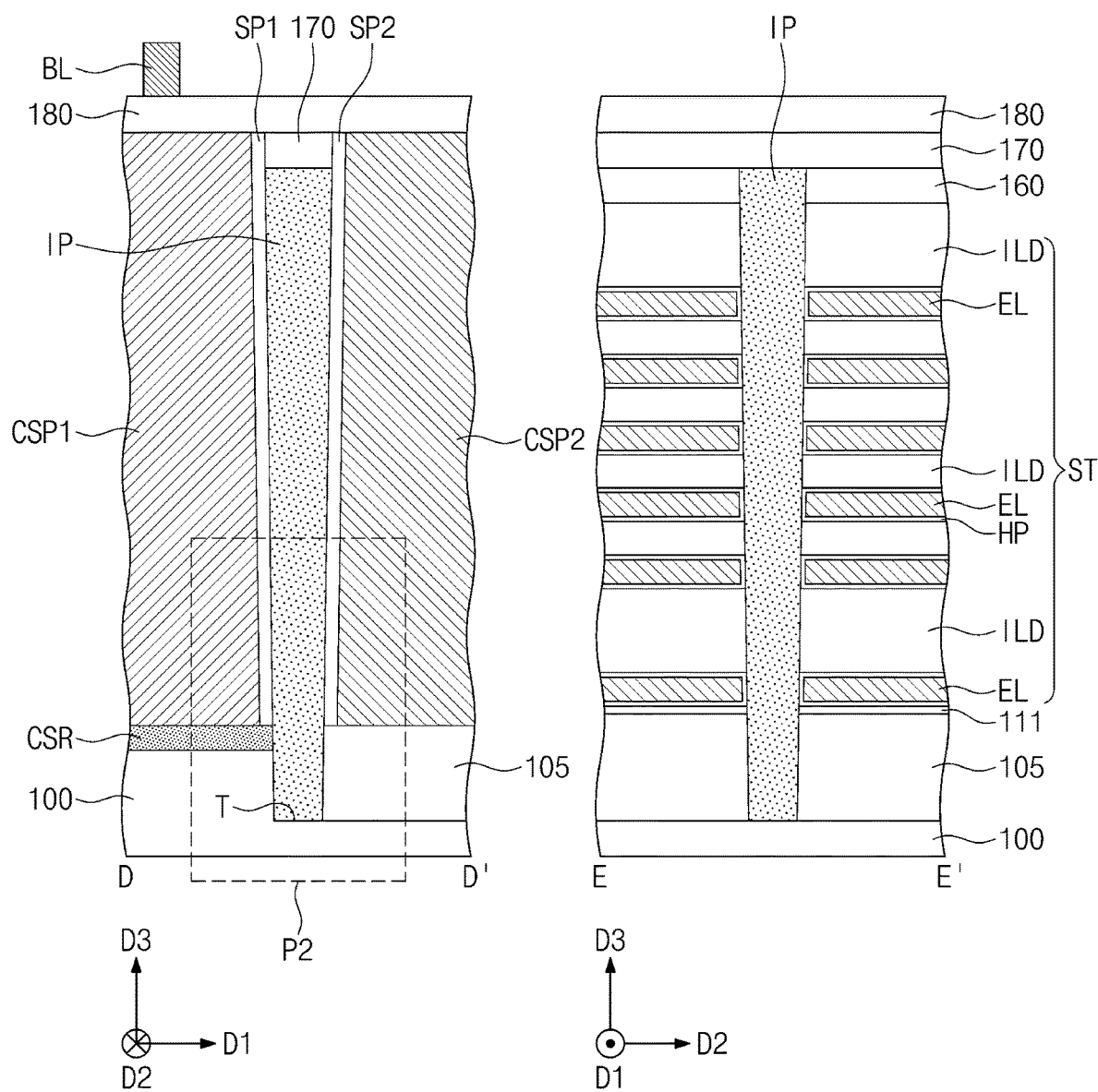
FIG. 3D illustrates a cross-sectional view taken along lines D-D' and E-E' of FIG. 2, showing a three-dimensional semiconductor memory device according to some example embodiments of inventive concepts.
Figure 4A:
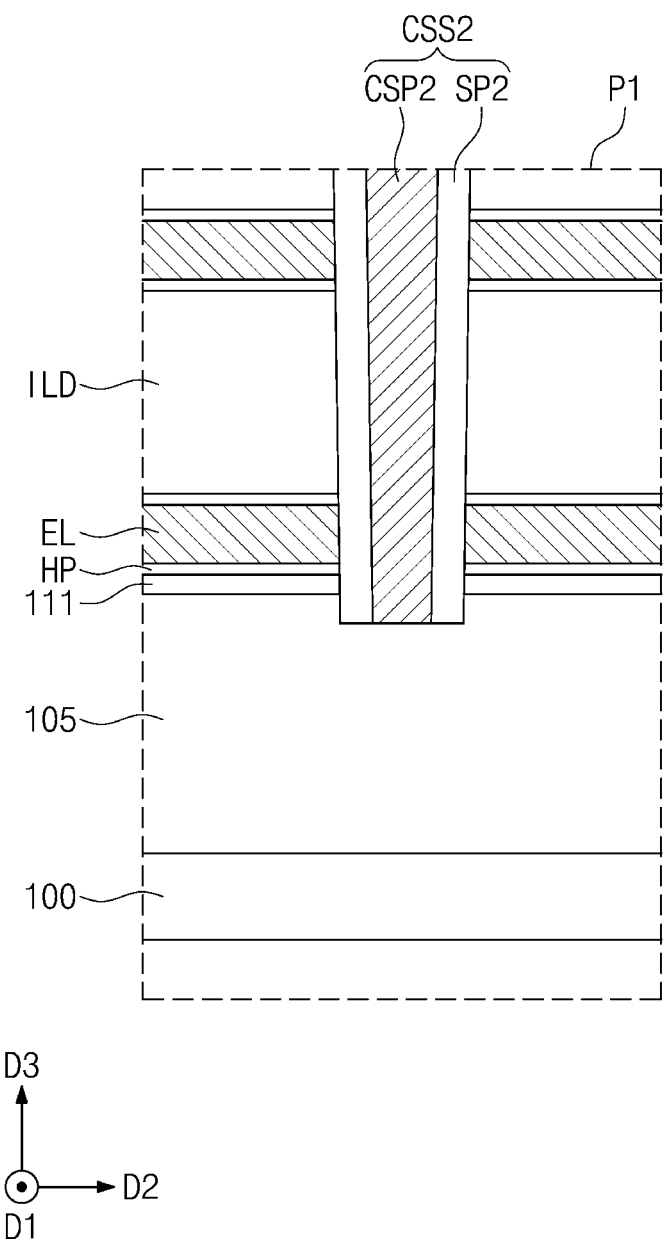
FIGS. 4A, 4B, and 4C illustrate enlarged views of section P1 of FIG. 3C, showing a three-dimensional semiconductor memory device according to some example embodiments of inventive concepts.
Figure 4B:
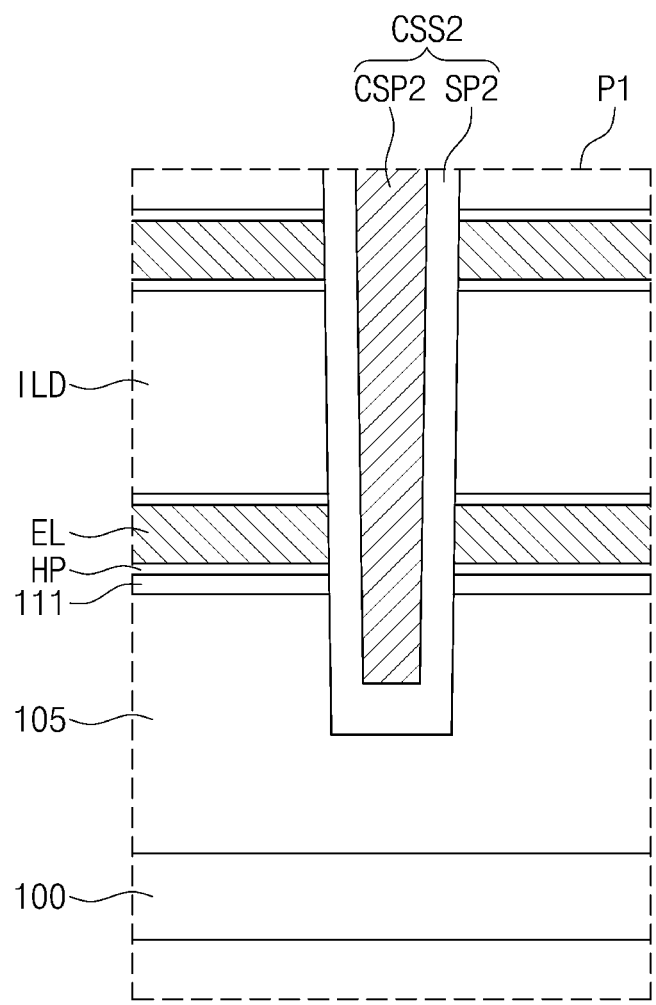
Figure 4C:
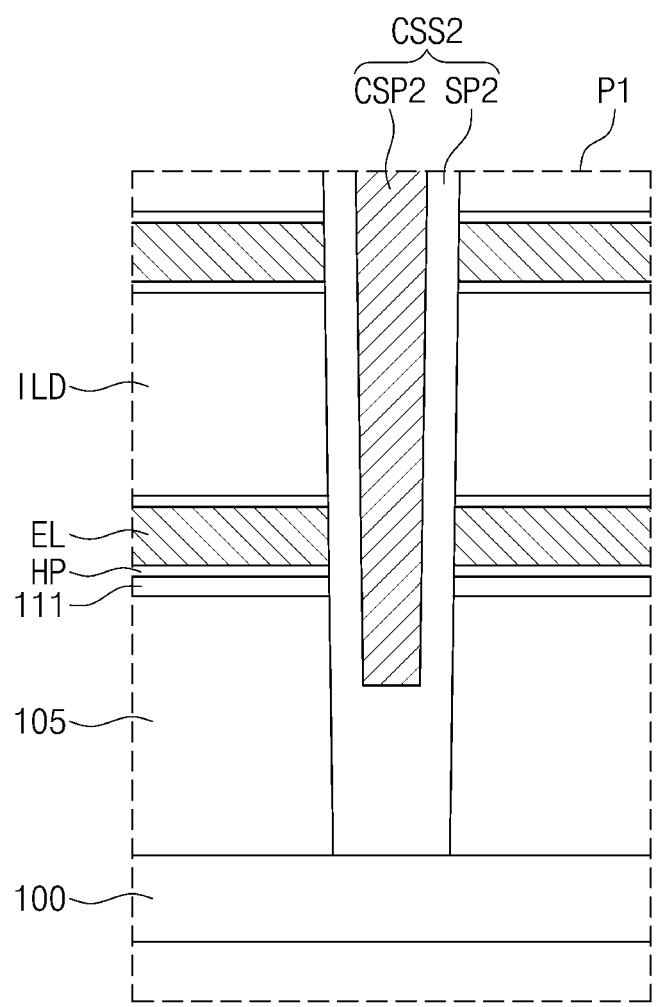
Figure 5A:
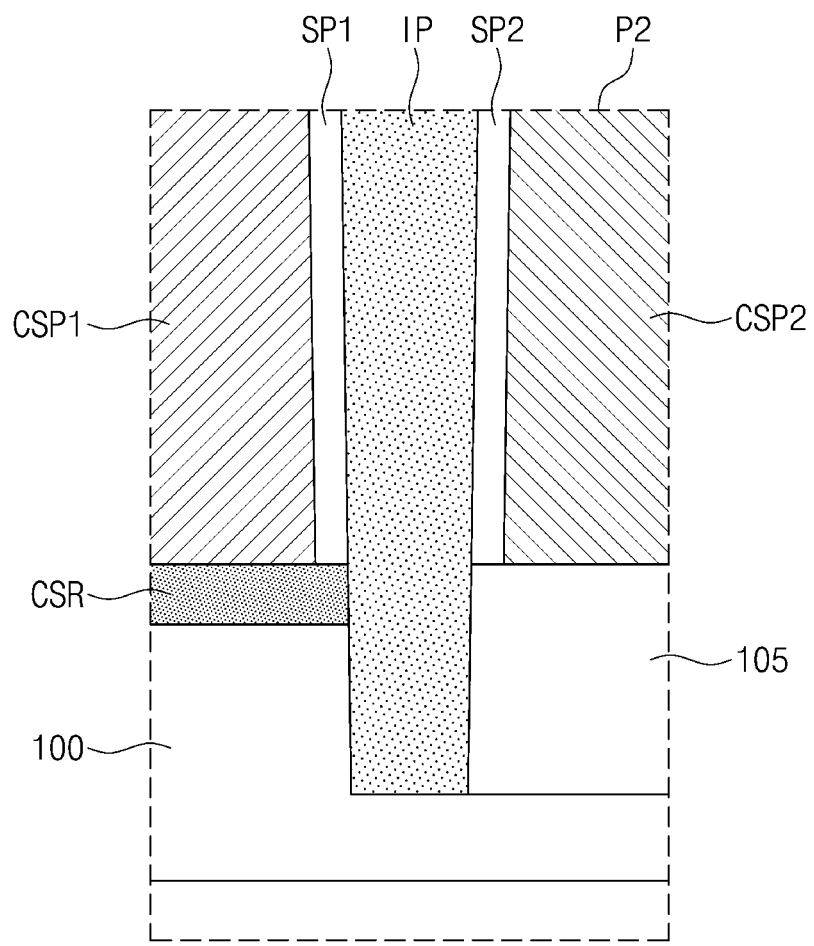
FIGS. 5A, 5B, and 5C illustrate enlarged views of section P2 of FIG. 3D, showing a three-dimensional semiconductor memory device according to some example embodiments of inventive concepts.
Figure 5B:
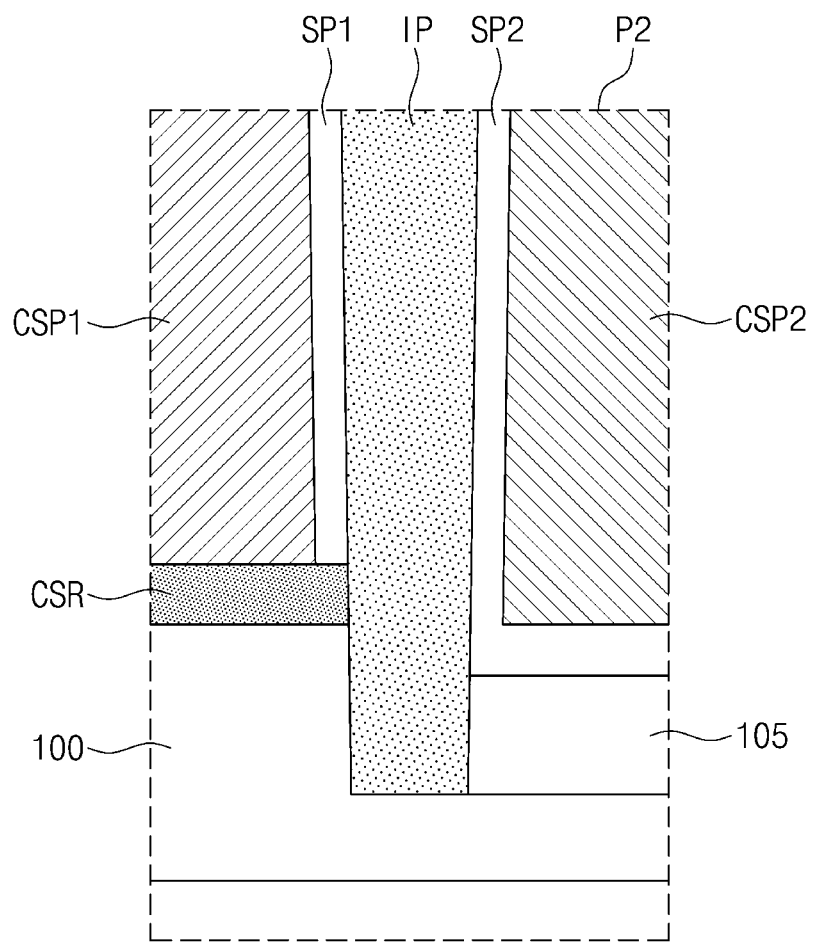
Figure 5C:
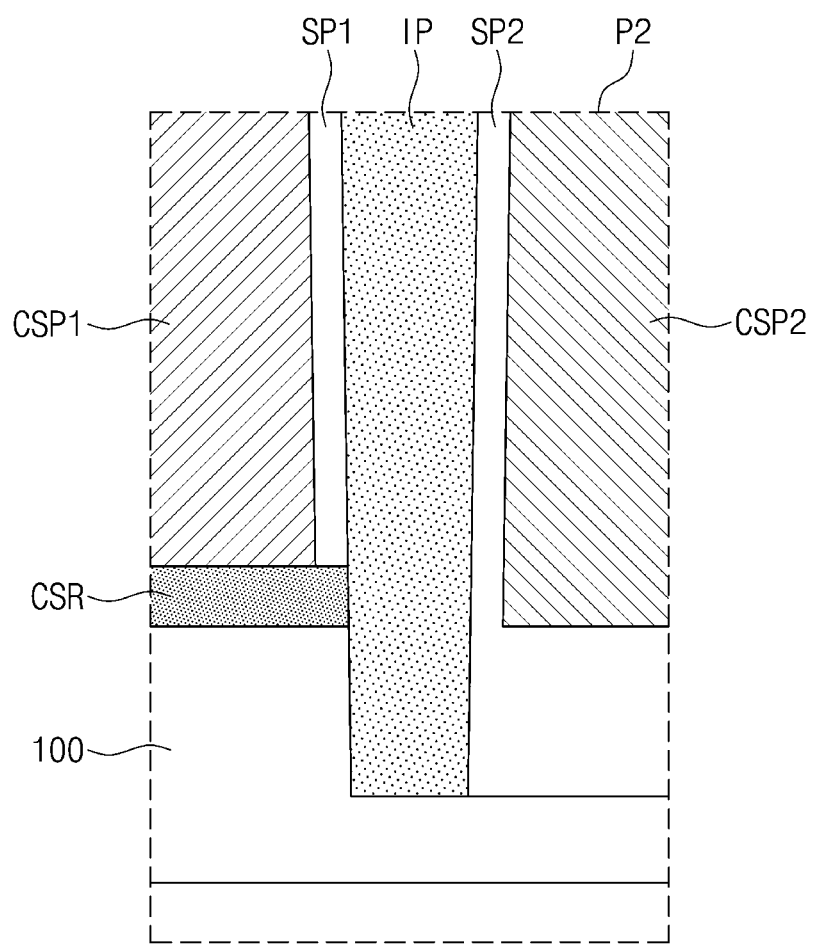

FIG. 2 illustrates a plan view showing a three-dimensional semiconductor memory device according to some example embodiments of inventive concepts. FIGS. 3A, 3B, and 3C illustrate cross-sectional views respectively taken along lines A-A', B-B', and C-C' of FIG. 2, showing a three-dimensional semiconductor memory device according to some example embodiments of inventive concepts. FIG. 3D illustrates a cross-sectional view taken along lines D-D' and E-E' of FIG. 2, showing a three-dimensional semiconductor memory device according to some example embodiments of inventive concepts. FIGS. 4A, 4B, and 4C illustrate enlarged views of section P1 of FIG. 3C, showing a three-dimensional semiconductor memory device according to some example embodiments of inventive concepts. FIGS. 5A, 5B, and 5C illustrate enlarged views of section P2 of FIG. 3D, showing a three-dimensional semiconductor memory device according to some example embodiments of inventive concepts.

Referring to FIGS. 2 and 3A, a substrate 100 may include a cell array region CAR and a connection region CNR. The substrate 100 may be or include a silicon substrate, a silicon-germanium substrate, a germanium substrate, or a single crystalline epitaxial layer grown on a single crystalline silicon substrate. The substrate 100 may be doped with a first conductivity. The first conductivity may be, for example, P-type.

A dielectric pattern 105 may be disposed on the connection region CNR of the substrate 100. The dielectric pattern 105 may be provided on an upper portion of the substrate 100 on the connection region CNR. For example, as shown in FIG. 3A, the substrate 100 may include a trench T formed on the connection region CNR, and the dielectric pattern 105 may fill the trench T. The dielectric pattern 105 may have a top surface coplanar with a top surface of the substrate 100. The dielectric pattern 105 may have a bottom surface between top and bottom surfaces of the substrate 100. The dielectric pattern 105 may include an insulating material, such as silicon oxide.

Stack structures ST may be disposed on the top surface of the substrate 100 and the top surface of the dielectric pattern 105. In some example embodiments, a buffer dielectric layer 111 may be disposed on the top surface of the substrate 100 and the top surface of the dielectric pattern 105. The stack structures ST may be disposed on the buffer dielectric layer 111. The stack structures ST may extend in a first direction D1 parallel to the top surface of the substrate 100. The stack structure ST may include a first stack structure ST1 and a second stack structure ST2 adjacent to each other. The first and second stack structures ST1 and ST2 may extend in parallel in the first direction D1. The first and second stack structures ST1 and ST2 may be spaced apart in a second direction D2 from each other across a common source structure CSS. Each of the stack structures ST may include electrodes EL vertically stacked on the substrate 100 and insulation layers ILD interposed between the electrodes EL.

For example, each of the stack structures ST may have a stepwise structure on the connection region CTR. The electrodes EL may have lengths in the first direction D1 that decrease with increasing distance from the substrate 100. Each of the stack structures ST may have a height that decreases as approaching the connection region CNR from the cell array region CAR. The electrodes EL may have sidewalls that are equally spaced apart from each other along the first direction D1 in a plan view. Each of the electrodes EL may have a pad portion on the connection region CNR, and the pad portions of the electrodes EL may be horizontally and vertically placed at different positions. The electrodes EL may be stacked to cause the pad portions to form the stepwise structure. When viewed in plan, the stepwise structures of the stack structures ST may overlap the dielectric pattern 105. For example, the dielectric pattern 105 may be placed below the stepwise structures of the stack structures ST.

The electrodes EL of the stack structures ST may serve as control gate electrodes of the memory cell transistors MCT of FIG. 1. For example, the electrodes EL may be used as the ground select lines GSL0 to GLS2, the word lines WL0 to WLn and DWL, and the string select lines SSL1 and SSL2 discussed with reference to FIG. 1.

The common source structures CSS may be disposed between the stack structures ST. In some example embodiments, each of the common source structures CSS may extend in the first direction D1 and have a substantially uniform top width in the second direction D2. For example, each of the common source structures CSS may have a plate shape. The common source structures CSS may be spaced apart from each other in the second direction D2. Each of the common source structures CSS may apply a voltage to a common source region CSR, which will be discussed later, when the three-dimensional semiconductor memory device operates in a read or write mode.

For example, a first common source structure CSS1 and a second common source structure CSS2 may be disposed between the first and second stack structures ST1 and ST2 adjacent to each other. Each of the first and second common source structures CSS1 and CSS2 may extend in the first direction D1. The first and second common source structures CSS1 and CSS2 may be spaced apart in the first direction D1 from each other across a vertical dielectric structure IP. The first common source structure CSS1, the second common source structure CSS2, and the vertical dielectric structure IP will be further discussed in detail below with reference to FIGS. 3B, 3C, and 3D.

A plurality of first vertical channel structures VS1 may penetrate the stack structures ST on the cell array region CAR and may be connected to the substrate 100. When viewed in plan, the first vertical channel structures VS1 may be arranged in a zigzag fashion along the first direction D1. The first vertical channel structures VS1 may include a semiconductor material, such as silicon (Si), germanium (Ge), or a mixture thereof. The first vertical channel structures VS1 may be used as channels of the select transistors SST and GST and the memory cell transistors MCT discussed with reference to FIG. 1.

Each of the first vertical channel structures VS1 may include a first lower semiconductor pattern LSP1 and a first upper semiconductor pattern USP1. The first lower semiconductor pattern LSP1 may directly contact the substrate 100 and may include a pillar-shaped epitaxial layer grown from the substrate 100. The first lower semiconductor pattern LSP1 may include silicon (Si), germanium (Ge), silicon-germanium (Ge), a III-V group semiconductor compound, or a II-VI group semiconductor compound. The first lower semiconductor pattern LSP1 may include an intrinsic semiconductor or a semiconductor doped with impurities of the first conductivity.

The first lower semiconductor pattern LSP1 may have a first height in a third direction D3, and the first height may be greater than a thickness of a lowermost electrode EL. The first lower semiconductor pattern LSP1 may have a top surface at a level higher than that of a top surface of the lowermost electrode EL. The top surface of the first lower semiconductor pattern LSP1 may be located at a level lower than that of a top surface of a lowermost insulation layer ILD on the lowermost electrode EL. The first lower semiconductor pattern LSP1 may have a bottom surface at a level lower than that of a bottom surface of the lowermost electrode EL and higher than that of a bottom surface of the dielectric pattern 105. A gate dielectric layer 15 may be disposed on a portion of a sidewall of the first lower semiconductor pattern LSP1. The gate dielectric layer 15 may be disposed between the lowermost electrode EL and the first lower semiconductor pattern LSP1. The gate dielectric layer 15 may include a silicon oxide layer (e.g., a thermal oxide layer). The gate dielectric layer 15 may have a rounded sidewall.

The first upper semiconductor pattern USP1 may directly contact the first lower semiconductor pattern LSP1 and may have a U shape or a pipe shape whose bottom end is closed. The first upper semiconductor pattern USP1 may have an inside filled with a first buried dielectric pattern VI1 including an insulating material. The first upper semiconductor pattern USP1 may include an intrinsic semiconductor or a semiconductor doped with impurities of the first conductivity. The first upper semiconductor pattern USP1 may have a crystalline structure different from that of the first lower semiconductor pattern LSP1. Each of the first vertical channel structures VS1 may have a top end, which corresponds to a top end of the first upper semiconductor pattern USP1 and is provided thereon with a bit line conductive pad PAD1 coupled to a bit line contact plug BPLG.

A first vertical dielectric pattern VP1 may be disposed between the electrode structure ST and the first upper semiconductor pattern USP1. The first vertical dielectric pattern VP1 may extend in the third direction D3 and surround a sidewall of the first upper semiconductor pattern USP1. For example, the first vertical dielectric pattern VP1 may have a macaroni shape or a pipe shape whose top and bottom ends are opened. In some example embodiments, the first vertical dielectric pattern VP1 may include a tunnel insulation layer, a charge storage layer, and a blocking insulation layer, which layers constitute a data storage layer of a NAND Flash memory device.

On the connection region CNR, a plurality of second vertical channel structures VS2 may penetrate a planarized dielectric layer 150, the stack structures ST, and the dielectric pattern 105. Differently from that shown, when viewed in plan, the second vertical channel structures VS2 may have various shapes. For example, when viewed in plan, the second vertical channel structures VS2 may have an oval shape, an L shape, and the like. The second vertical channel structures VS2 may have bottom surfaces at a level lower than that of bottom surfaces of the first vertical channel structures VS2. In some example embodiments, the second vertical channel structures VS2 may be connected to the substrate 100. As shown in FIG. 3A, the bottom surfaces of the second vertical channel structures VS2 may contact a bottom surface of the trench T of the substrate 100.

Differently from that shown, in other example embodiments, the second vertical channel structures VS2 may penetrate the substrate 100 to extend downwardly below the substrate 100. In other example embodiments, the bottom surfaces of the second vertical channel structures VS2 may be located at a level higher than that of the bottom surface of the trench T of the substrate 100.

The second vertical channel structures VS2 may include the same semiconductor material as that of the first vertical channel structures VS1. Each of the second vertical channel structures VS2 may include a second lower semiconductor pattern LSP2 and a second upper semiconductor pattern USP2. The second lower semiconductor pattern LSP2 may have a height in the third direction D3 less than a height in the third direction D3 of the first lower semiconductor pattern LSP1.

The second upper semiconductor pattern USP2 may directly contact the second lower semiconductor pattern LSP2 and may have a U shape or a pipe shape whose bottom end is closed. The second upper semiconductor pattern USP2 may have an inside filled with a second buried dielectric pattern VI2 including an insulating material. The second upper semiconductor pattern USP2 may include the same semiconductor material as that of the first upper semiconductor pattern USP1.

A second vertical dielectric pattern VP2 may be disposed between the electrode structure ST and the second upper semiconductor pattern USP2. The second vertical dielectric pattern VP2 may extend along the third direction D3 between the dielectric pattern 105 and the second upper semiconductor pattern USP2. For example, the second vertical dielectric pattern VP2 may have a sidewall whose portion is in direct with the dielectric pattern 105. Likewise the first vertical dielectric pattern VP1, the second vertical dielectric pattern VP2 may have a macaroni shape or a pipe shape whose top and bottom ends are opened.

Further, a horizontal dielectric pattern HP may be provided between the first vertical dielectric pattern VP1 and each of sidewalls of the electrodes EL and between the second vertical dielectric pattern VP2 and each of sidewalls of the electrodes EL. The horizontal dielectric pattern HP may extend onto top and bottom surfaces of the electrode EL from the sidewall of the electrode EL. The horizontal dielectric pattern HP may have a portion that extends onto top and bottom surfaces of the bottommost electrode EL from between the bottommost electrode EL and the gate dielectric layer 15 on a side of the first lower semiconductor pattern LSP1. The horizontal dielectric pattern HP may include a charge storage layer and a tunnel insulation layer that correspond to a portion of a data storage layer of a NAND Flash memory device.

The planarized dielectric layer 150 may cover the stack structures ST. The planarized dielectric layer 150 may cover the stepwise structures of the electrode structures ST on the connection region CNR and have a substantially flat top surface. The planarized dielectric layer 150 may include a single dielectric layer or a plurality of stacked dielectric layers. The planarized dielectric layer 150 may include, for example, a silicon oxide layer or a low-k dielectric layer.

A first interlayer dielectric layer 160, a second interlayer dielectric layer 170, and a third interlayer dielectric layer 180 may be sequentially stacked on the planarized dielectric layer 150. The first interlayer dielectric layer 160 may cover top surfaces of the first and second vertical channel structures VS1 and VS2. The second interlayer dielectric layer 170 may be disposed on the first interlayer dielectric layer 160. As shown in FIG. 3D, the second interlayer dielectric layer 170 may cover a top surface of the vertical dielectric structure IP. The third interlayer dielectric layer 180 may be disposed on the second interlayer dielectric layer 170. As shown in FIGS. 3B and 3C, the third interlayer dielectric layer 180 may cover a top surface of the common source structure CSS.

Bit lines BL may be disposed on the third interlayer dielectric layer 180 of the cell array region CAR. The bit lines BL may extend in the second direction D2 and may connect the first vertical channel structures VS1 to each other. The bit lines BL may be electrically connected to the first vertical channel structures VS1 through the bit line contact plugs BPLG.

On the connection region CNR, cell contact plugs CPLG may penetrate the first and second interlayer dielectric layers 160 and 170 and the planarized dielectric layer 150, and thus may be connected to corresponding pad portions of the electrodes EL. The cell contact plugs CPLG may have vertical lengths that decrease as approaching the cell array region CAR from the connection region CNR. The cell contact plugs CPLG may have top surfaces substantially coplanar with each other. The third interlayer dielectric layer 180 of the connection region CNR may be provided thereon with connection lines CL connected to the cell contact plugs CPLG.

Referring to FIGS. 2 and 3B to 3D, the first and second common source structures CSS1 and CSS2 may be disposed between the first and second stack structures ST1 and ST2. The first and second common source structures CSS1 and CSS2 may extend in the first direction D1 between facing lateral surfaces of the first and second stack structures ST1 and ST2.

For example, the first common source structure CSS1 may be disposed on the cell array region CAR of the substrate 100. The first common source structure CSS1 may be connected to the substrate 100. The first common source structure CSS1 may include a first dielectric spacer SP1 covering sidewalls of the stack structures ST and a first common source plug CSP1 penetrating the first dielectric spacer SP1 and having connection with the substrate 100.

The first common source plug CSP1 may have a plate shape extending along a common source region CSR. The first common source plug CSP1 may directly contact the substrate 100. In some example embodiments, the first common source plug CSP1 may have a bottom surface whose vertical position is lower than the top surface of the substrate 100. The first common source plug CSP1 may include one or more of a doped semiconductor, a conductive material such as conductive metal nitride, and a metal such as tungsten, copper, titanium, or aluminum. The first dielectric spacer SP1 may electrically separate the first common source plug CSP1 from the electrodes EL of the stack structures ST. The first dielectric spacers SP1 may face each other between the stack structures ST adjacent to each other. The first dielectric spacer SP1 may be formed of silicon oxide, silicon nitride, silicon oxynitride, or a low-k dielectric material having a low dielectric constant.

The common source regions CSR may be provided in the substrate 100 between the stack structures ST adjacent to each other. When viewed in plan, the common source regions CSR may extend in the first direction D1 parallel to the stack structures ST. The common source regions CSR may be formed by doping the substrate 100 with impurities of a second conductivity. The common source regions CSR may include, for example, N-type impurities (e.g., arsenic (As) or phosphorous (P)). In some example embodiments, the common source regions CSR may be selectively formed on the cell array region CAR of the substrate 100. For example, the common source region CSR may be provided below the first common source plug CSP1, but not below a second common source plug CSP2 which will be discussed later.

The second common source structure CSS2 may be disposed on the connection region CNR of the substrate 100. The second common source structure CSS2 may be spaced apart from the substrate 100 across the dielectric pattern 105. The second common source structure CSS2 may include a second dielectric spacer SP2 covering sidewalls of the stack structures ST and a second common source plug CSP2 penetrating the second dielectric spacer SP2 and having connection with the dielectric pattern 105. The second common source structure CSS2 may include the same material as that of the first common source structure CSS1.

The second dielectric spacer SP2 may electrically separate the second common source plug CSP2 from the electrodes EL of the stack structures ST. Further, the dielectric pattern 105 may electrically separate the second common source plug CSP2 from the substrate 100. For example, the second common source plug CSP2 may be electrically floated. Because the second common source plug CSP2 is electrically floated, no voltage may be applied to the second common source plug CSP2 during an erase or program mode. Therefore, it may be possible to limit and/or prevent the occurrence of failure caused by a difference in voltage between the second common source plug CSP2 and the electrodes EL.

The second common source plug CSP2 may have a bottom surface at a level lower than that of the top surface of the dielectric pattern 105. For example, as shown in FIG. 4A, the bottom surface of the second common source plug CSP2 may be located between the top and bottom surfaces of the dielectric pattern 105.

In some example embodiments, as shown in FIG. 4B, the second dielectric spacer SP2 may remain below the bottom surface of the second common source plug CSP2. The second common source plug CSP2 may not penetrate a lower portion of the second dielectric spacer SP2. For example, the bottom surface of the second common source plug CSP2 may be spaced apart from the dielectric pattern 105 across the second dielectric spacer SP2. In some example embodiments, as shown in FIG. 4C, the second dielectric spacer SP2 may penetrate the dielectric pattern 105 and contact the substrate 100.

In some example embodiments, as shown in FIGS. 5B and 5C, the bottom surface of the second common source plug CSP2 may be located at a level lower than that of the bottom surface of the first common source plug CSP1.

Referring to FIGS. 2 and 3D, the vertical dielectric structure IP may be disposed between the first and second common source structures CSS1 and CSS2. Further, the vertical dielectric structure IP may be disposed between neighboring stack structures ST, or between the first and second stack structures ST1 and ST2. In some example embodiments, the vertical dielectric structure IP may have a pillar shape extending from a bottom surface of the second interlayer dielectric layer 170 toward the bottom surface of the trench T. For example, the vertical dielectric structure IP may be provided at an edge of the trench T, and thus may have a lateral surface in contact with an inner surface of the trench T. The vertical dielectric structure IP may have a width that decreases with increasing distance from the second interlayer dielectric layer 170. The vertical dielectric structure IP may have a bottom surface at substantially the same level as that of the bottom surface of the dielectric pattern 105. The top surface of the vertical dielectric structure IP may be located at a level lower than that of the top surface of the common source structure CSS and higher than that of the top surfaces of the first and second vertical channel structures VS1 and VS2.

In some example embodiments, the vertical dielectric structure IP may have a rectangular pillar shape. Opposite ones of lateral surfaces of the vertical dielectric structure IP may contact the first and second dielectric spacers SP1 and SP2. The other opposite lateral surfaces of the vertical dielectric structure IP may contact lateral surfaces of the stack structures ST facing each other. The vertical dielectric structure IP may directly contact the insulation layers ILD and the horizontal dielectric pattern HP. In some example embodiments, the vertical dielectric structure IP may be spaced apart from the electrodes EL across the horizontal dielectric patterns HP.

Figure 6:
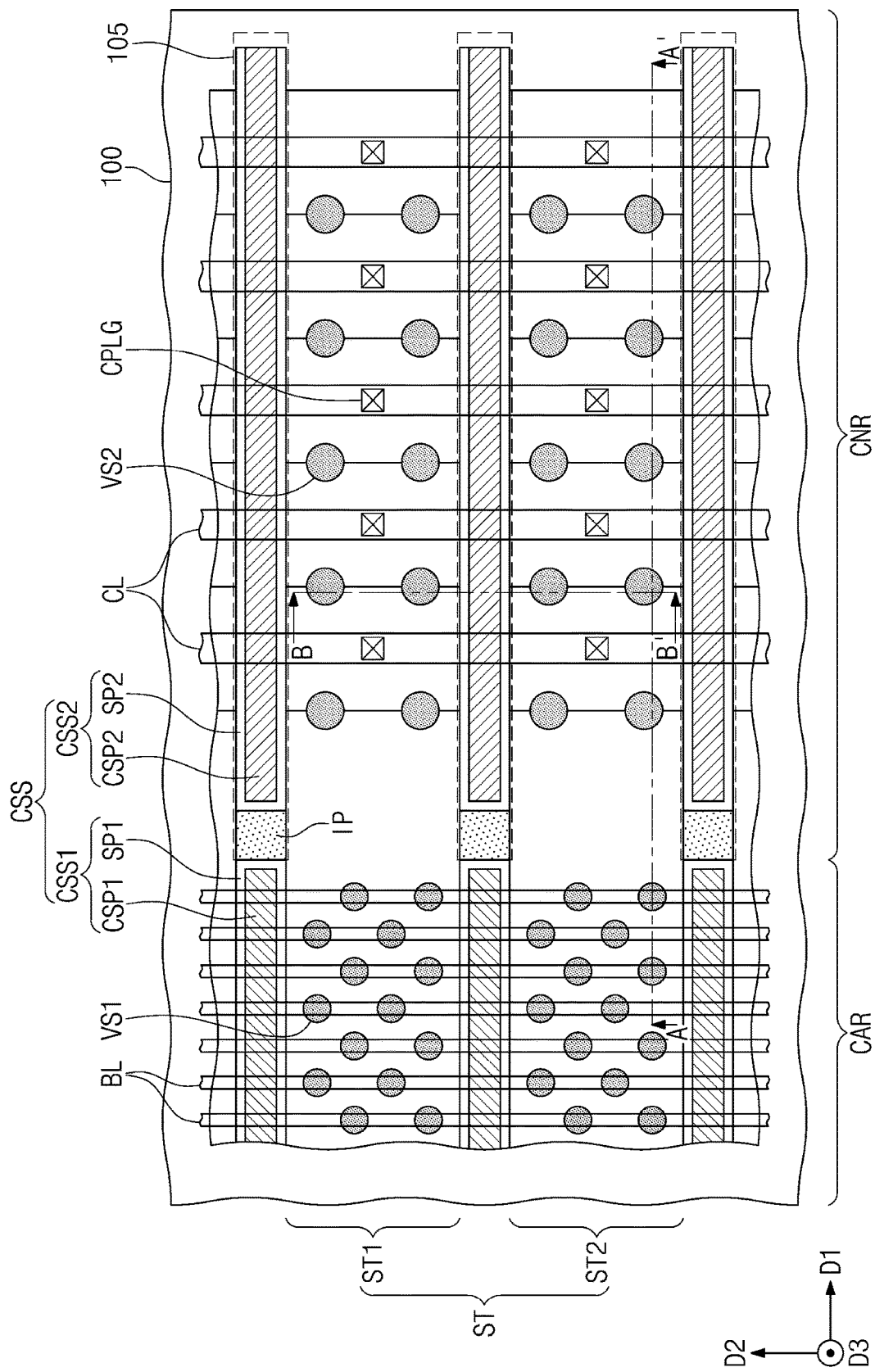
FIG. 6 illustrates a plan view showing a three-dimensional semiconductor memory device according to some example embodiments of inventive concepts.
Figure 7A:
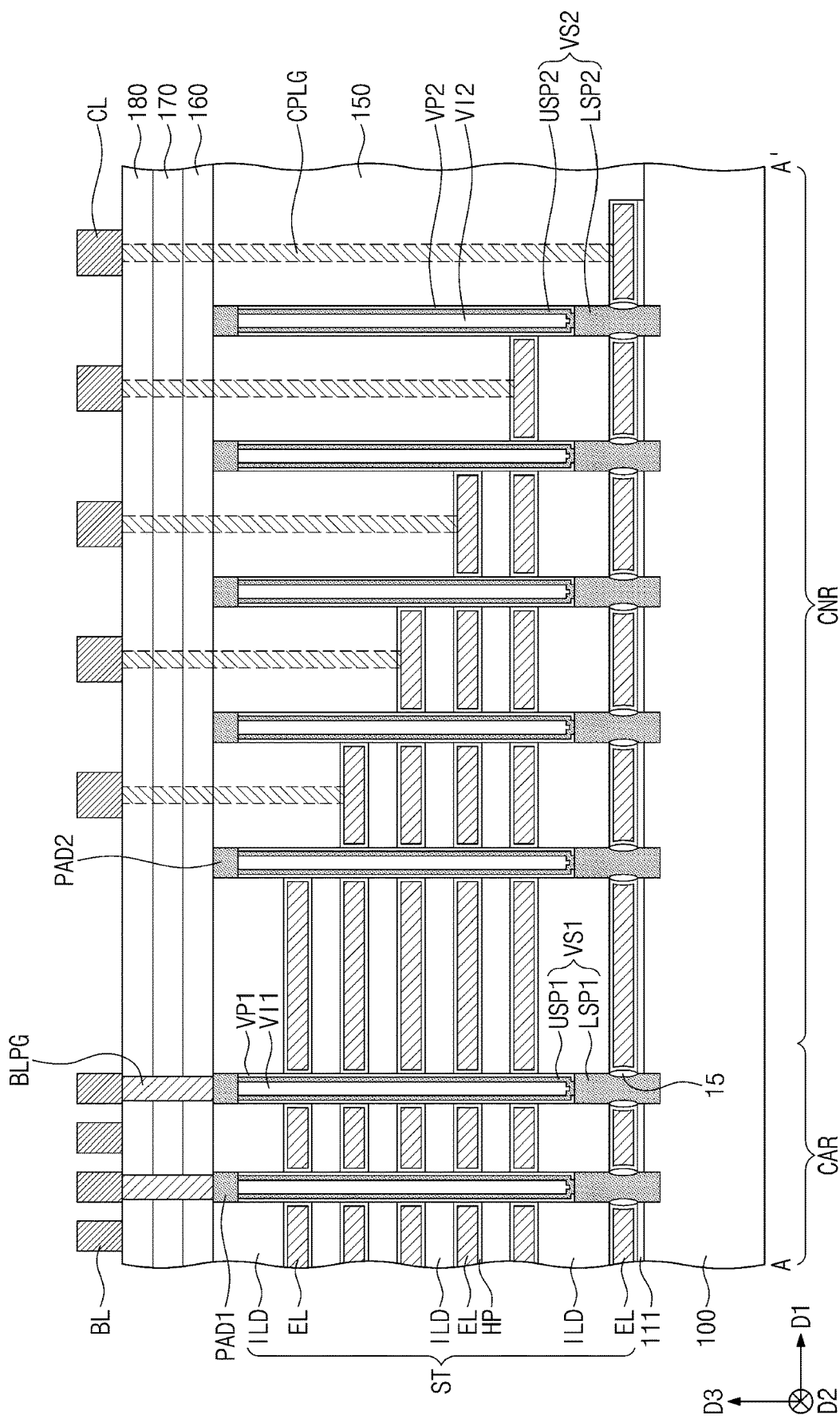
FIG. 7A illustrates a cross-sectional view taken along line A-A' of FIG. 6, showing a three-dimensional semiconductor memory device according to some example embodiments of inventive concepts.
Figure 7B:
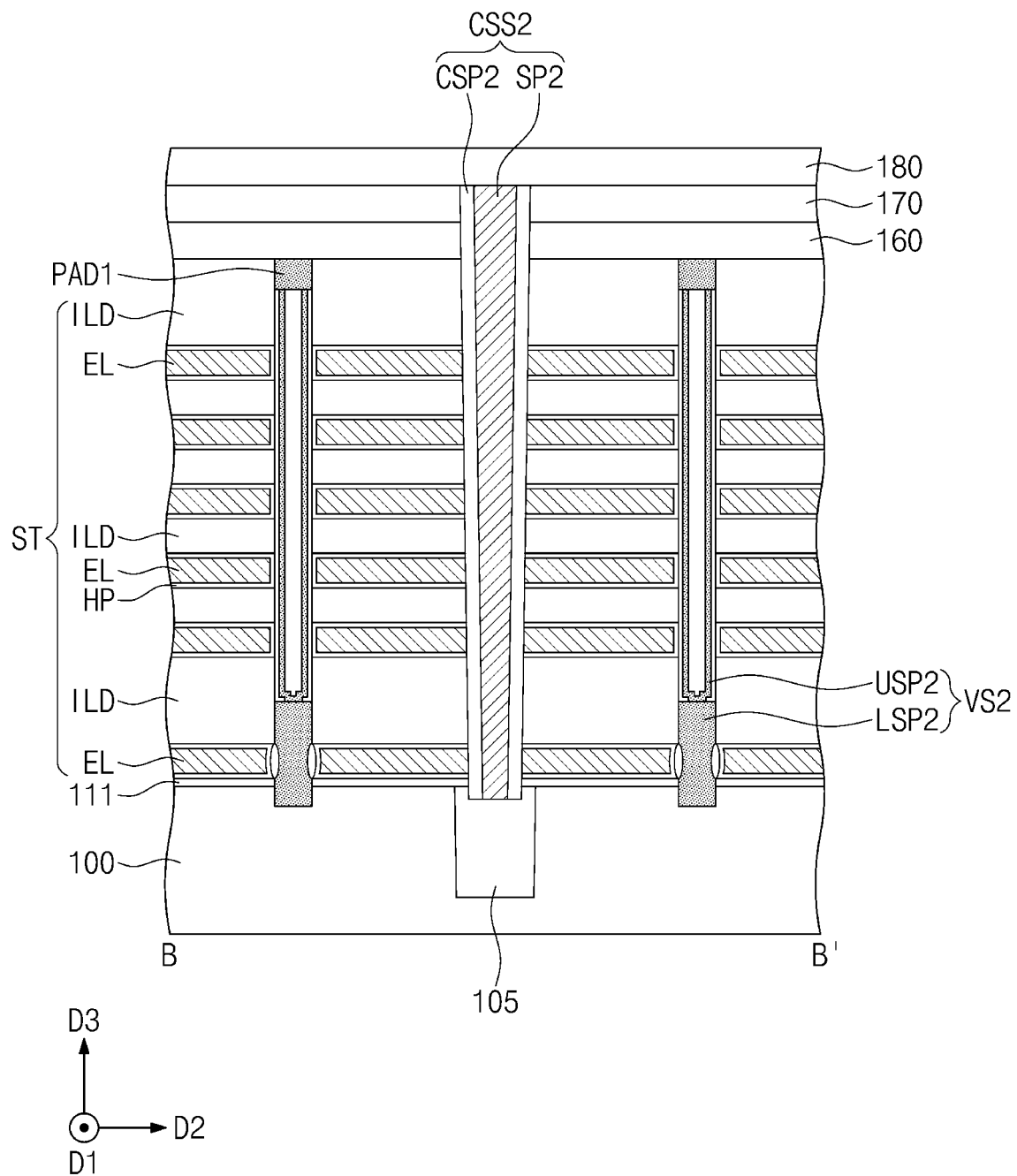
FIG. 7B illustrates a cross-sectional view taken along line B-B' of FIG. 6, showing a three-dimensional semiconductor memory device according to some example embodiments of inventive concepts.

FIG. 6 illustrates a plan view showing a three-dimensional semiconductor memory device according to some example embodiments of inventive concepts. FIGS. 7A and 7B illustrate cross-sectional views respectively taken along lines A-A' and B-B' of FIG. 6, showing a three-dimensional semiconductor memory device according to some example embodiments of inventive concepts.

For brevity of description, the following discussion may omit the technical features the same as those of the three-dimensional semiconductor memory device discussed above.

Referring to FIGS. 6, 7A, and 7B, a plurality of dielectric patterns 105 may be provided on the substrate 100. The dielectric patterns 105 may have linear shapes extending in the first direction D1 and may be spaced apart from each other in the second direction D2. As shown in FIG. 7B, the dielectric pattern 105 may be locally disposed between the second common source structure CSS2 and the substrate 100. Therefore, the second vertical channel structure VS2 may penetrate the stack structure ST and have connection with the top surface of the substrate 100. For example, no dielectric pattern 105 may be disposed between the second vertical channel structure VS2 and the substrate 100.

Figure 8:
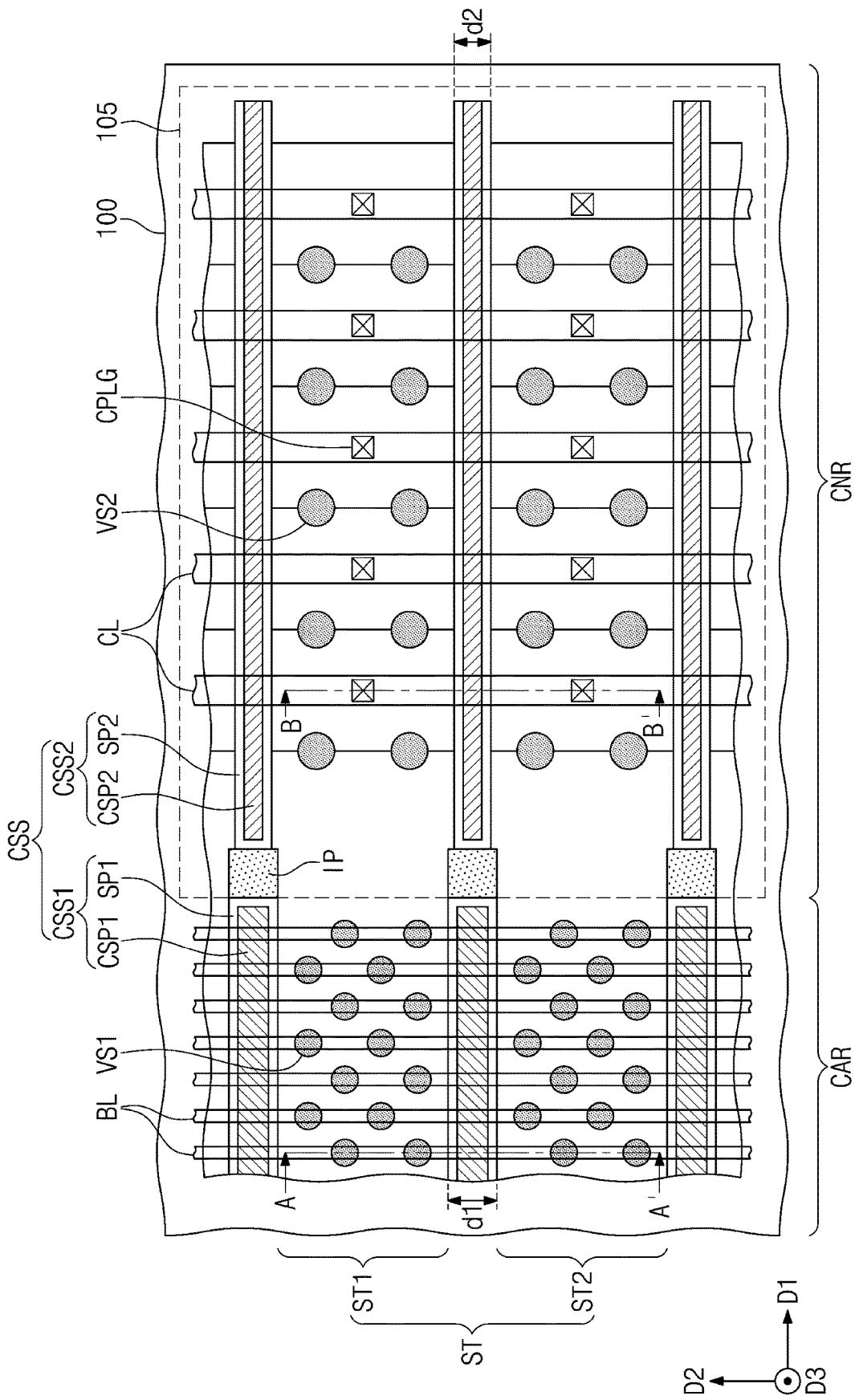
FIG. 8 illustrates a plan view showing a three-dimensional semiconductor memory device according to some example embodiments of inventive concepts.
Figure 9A:
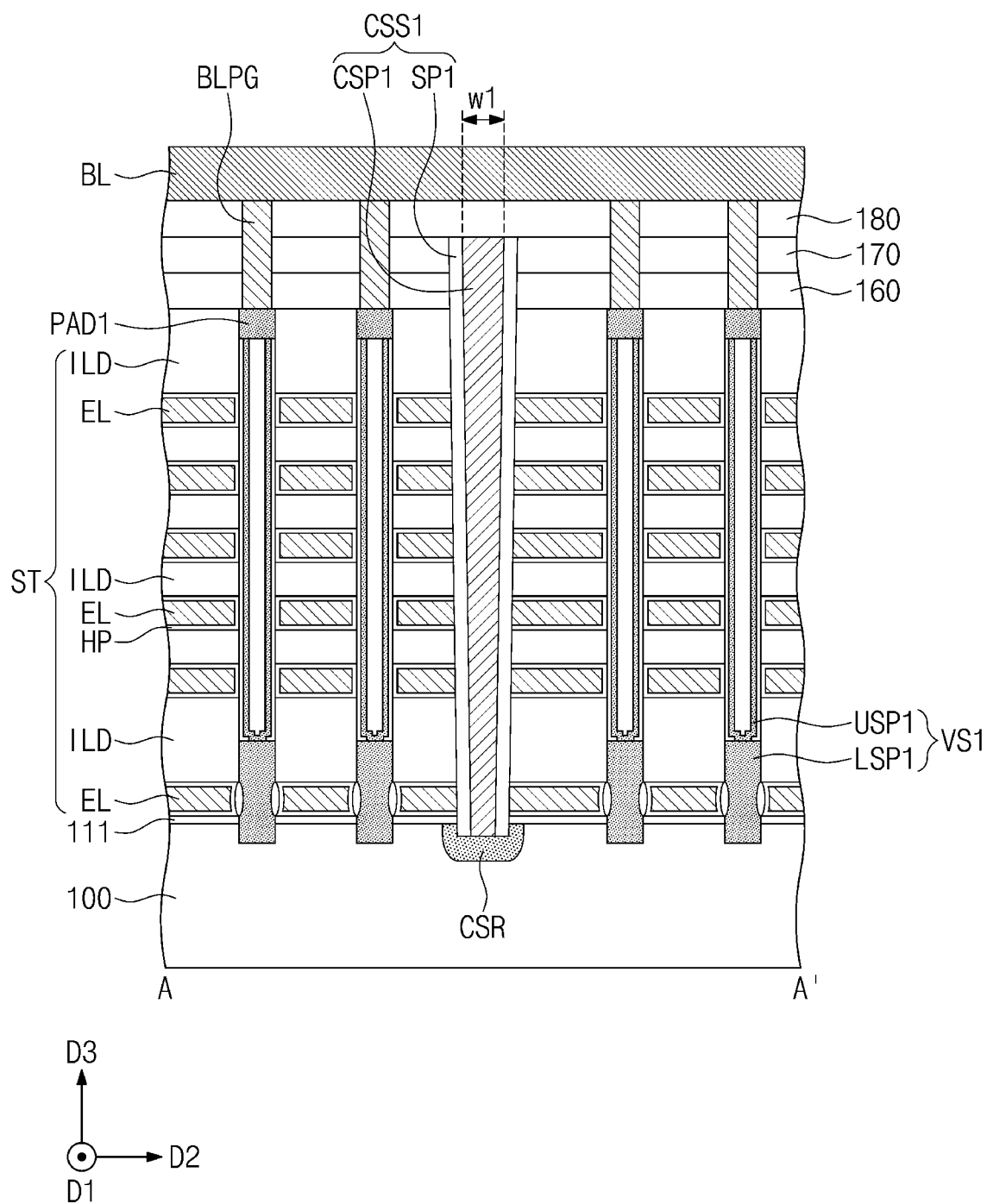
FIG. 9A illustrates a cross-sectional view taken along line A-A' of FIG. 8, showing a three-dimensional semiconductor memory device according to some example embodiments of inventive concepts.
Figure 9B:
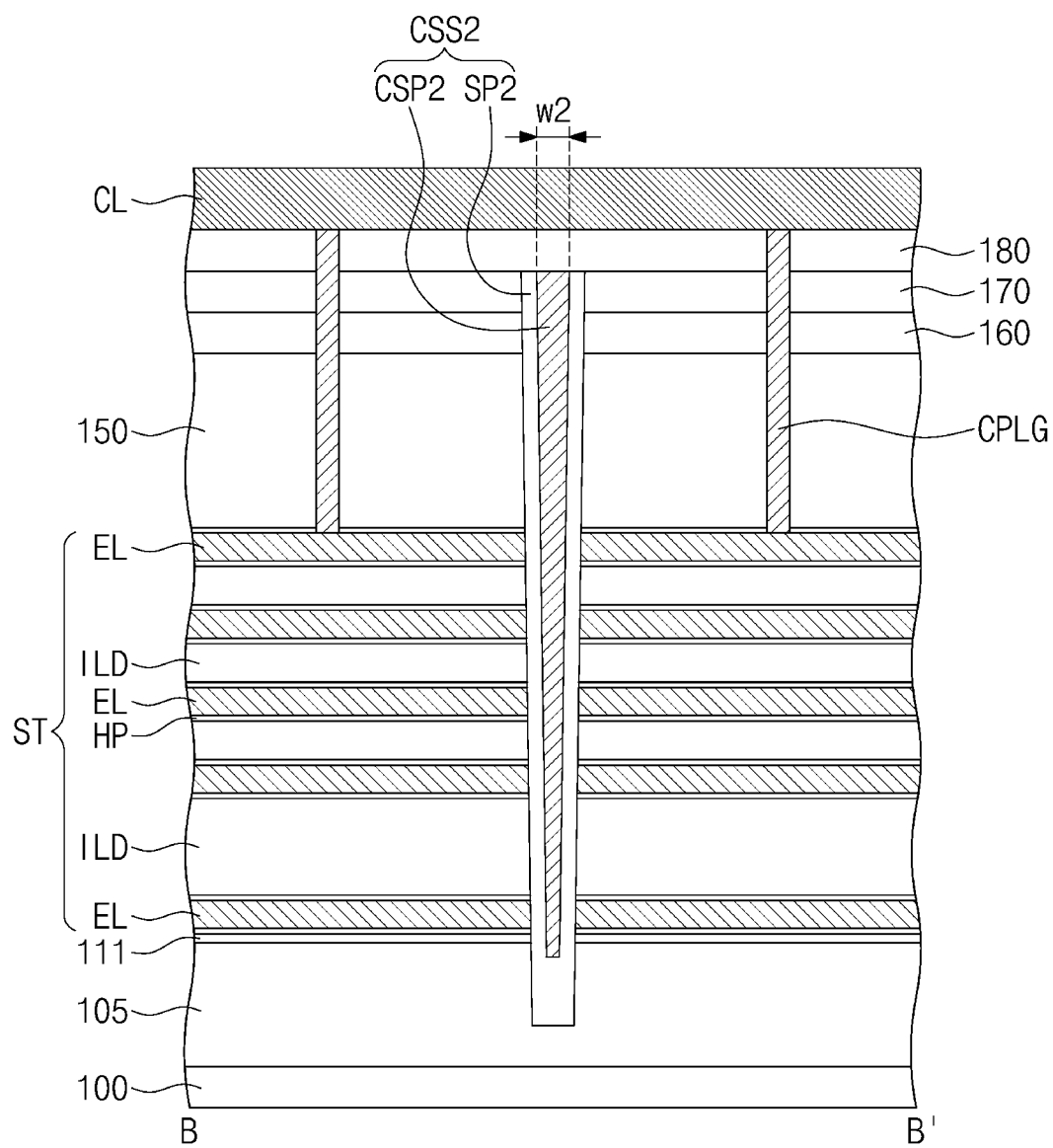
FIG. 9B illustrates a cross-sectional view taken along line B-B' of FIG. 8, showing a three-dimensional semiconductor memory device according to some example embodiments of inventive concepts.

FIG. 8 illustrates a plan view showing a three-dimensional semiconductor memory device according to some example embodiments of inventive concepts. FIGS. 9A and 9B illustrate cross-sectional views respectively taken along lines A-A' and B-B' of FIG. 8, showing a three-dimensional semiconductor memory device according to some example embodiments of inventive concepts.

For brevity of description, the following discussion may omit the technical features the same as those of the three-dimensional semiconductor memory device discussed above.

Referring to FIGS. 8, 9A, and 9B, the second common source structure CSS2 may have a width in the second direction D2 less than a width in the second direction D2 of the first common source structure CSS1. A distance d1 between the stack structures ST (e.g., between the first and second stack structures ST1 and ST2) adjacent to each other on the cell array region CAR may be less than a distance d2 between the stack structures ST (e.g., between the first and second stack structures ST1 and ST2) adjacent to each other on the connection region CNR. The second common source plug CSP2 may have a width w2 in the second direction D2 less than a width w1 in the second direction D2 of the first common source plug CSP1. In some example embodiments, the second dielectric spacer SP2 may remain below the second common source plug CSP2. In such cases, the second common source plug CSP2 may be effectively insulated from the substrate 100. This will be further discussed in detail with reference to FIGS. 17A to 17C.

Figure 10:
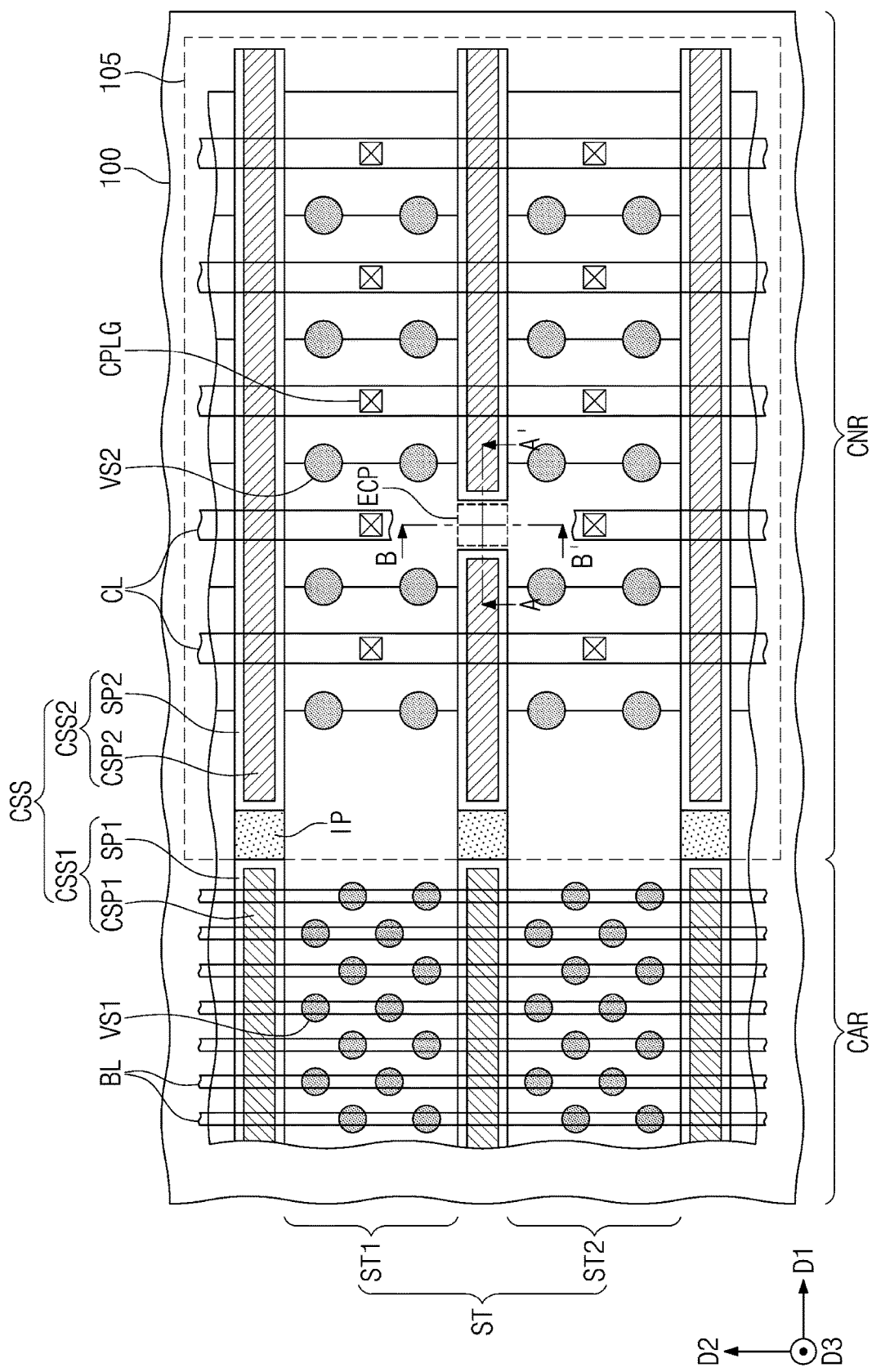
FIG. 10 illustrates a plan view showing a three-dimensional semiconductor memory device according to some example embodiments of inventive concepts.
Figure 11:
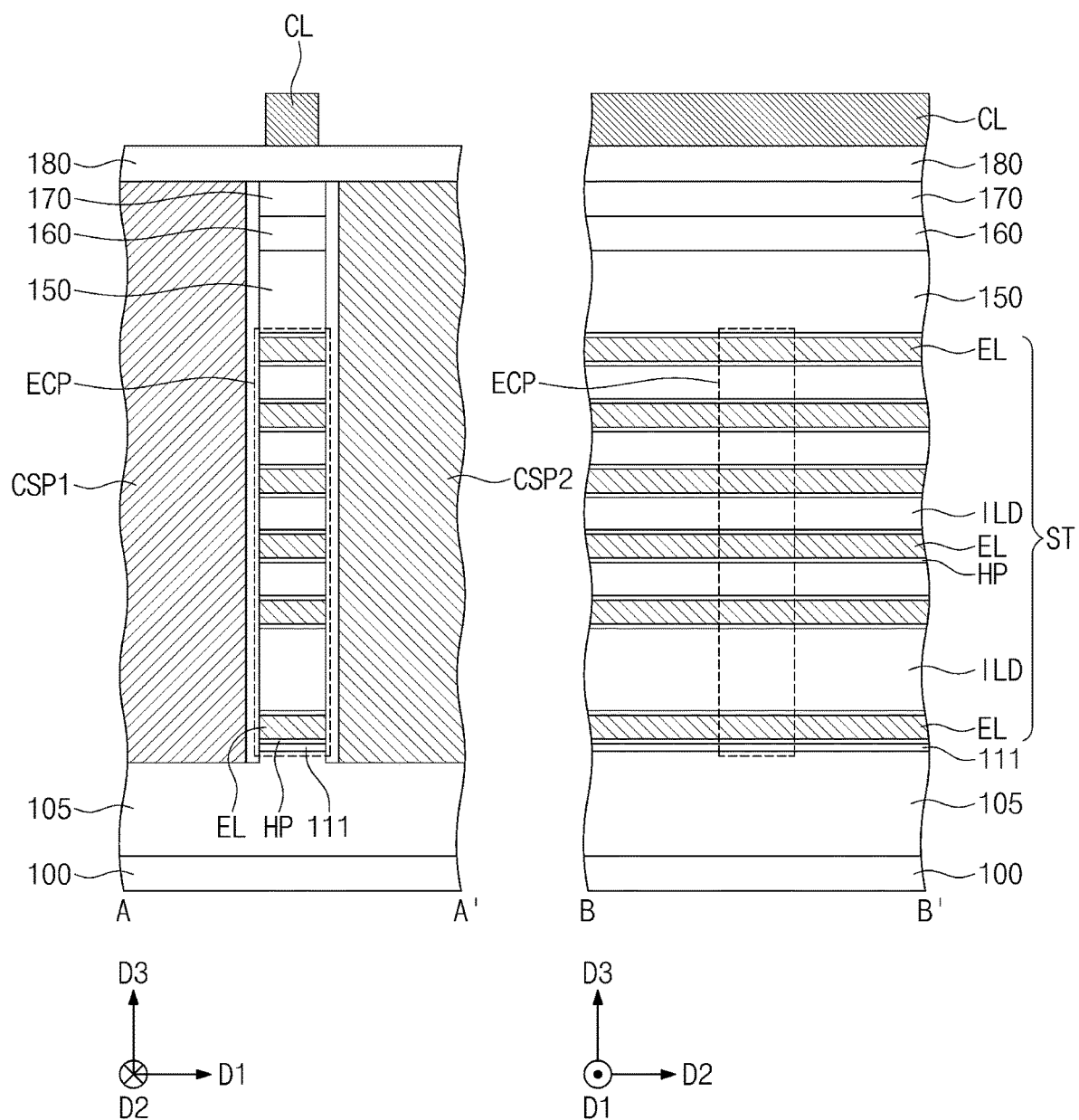
FIG. 11 illustrates a cross-sectional view taken along lines A-A' and B-B' of FIG. 10, showing a three-dimensional semiconductor memory device according to some example embodiments of inventive concepts.
Figure 12A:
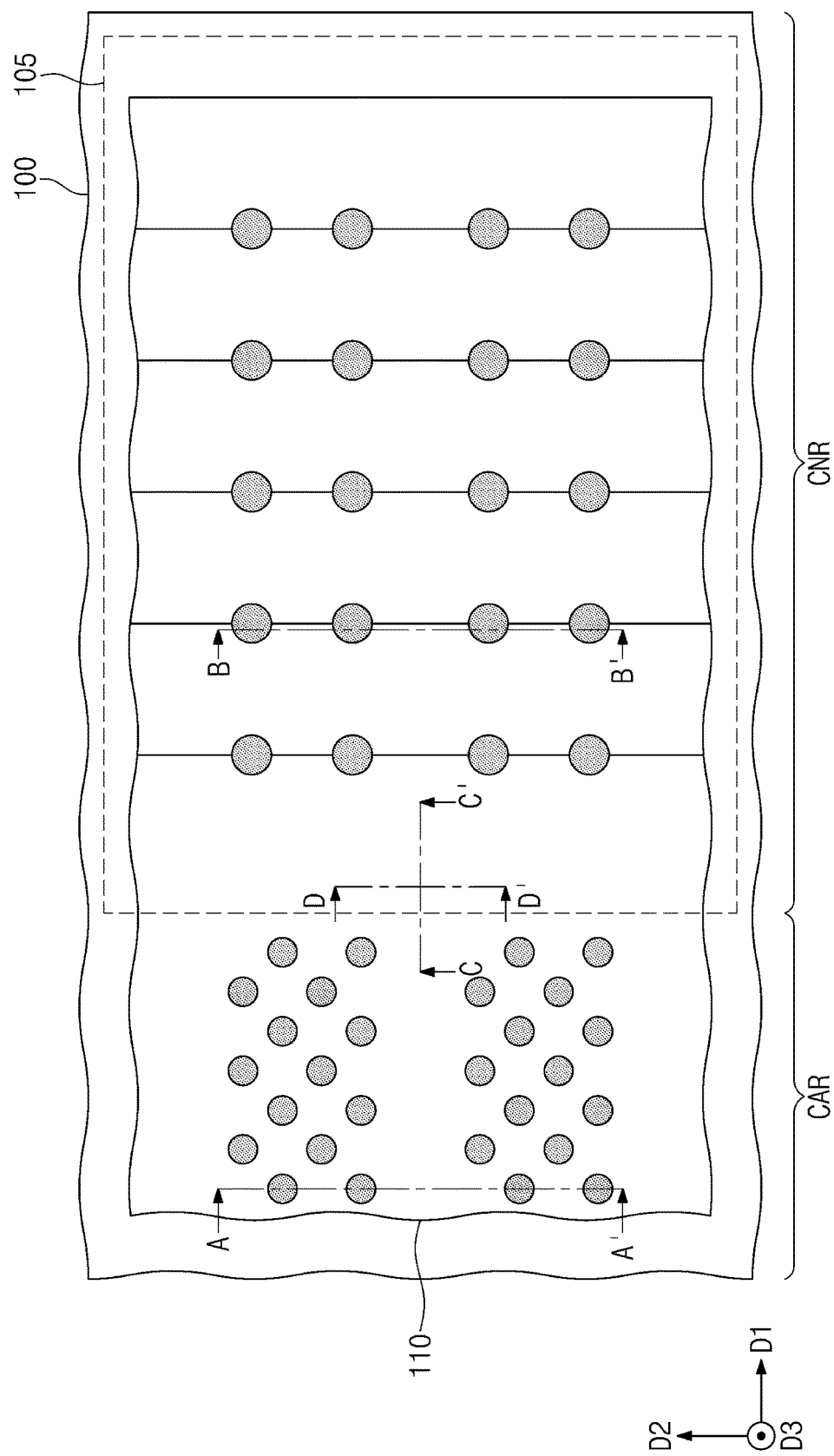
Figure 12B:
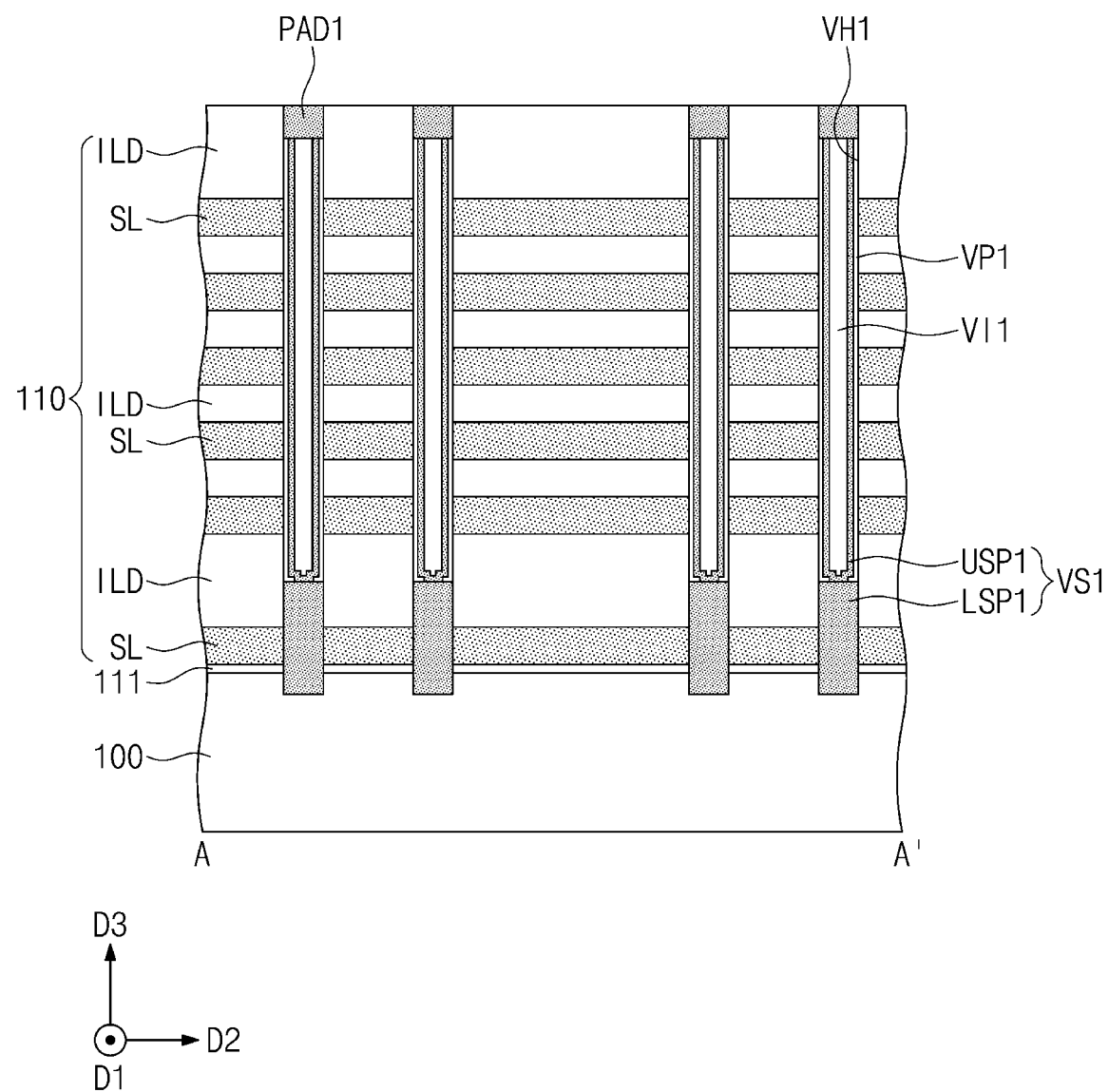
FIGS. 12B, 13B, 14B, 15B, and 16B illustrate cross-sectional views taken along line A-A' of FIGS. 12A, 13A, 14A, 15A, and 16A, respectively.
Figure 12C:
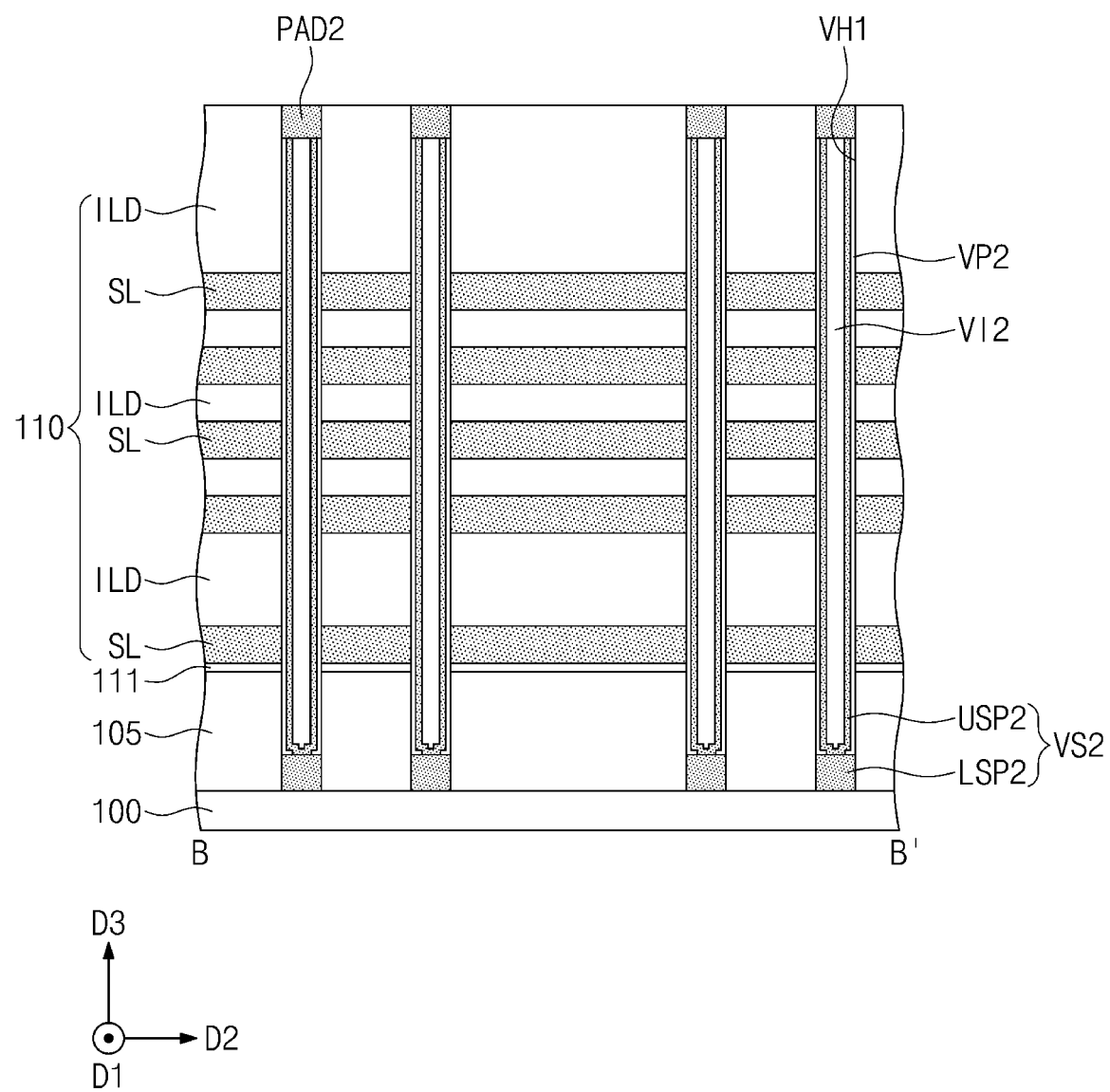
FIGS. 12C, 13C, 14C, 15C, and 16C illustrate cross-sectional views taken along line B-B' of FIGS. 12A, 13A, 14A, 15A, and 16A, respectively.
Figure 12D:
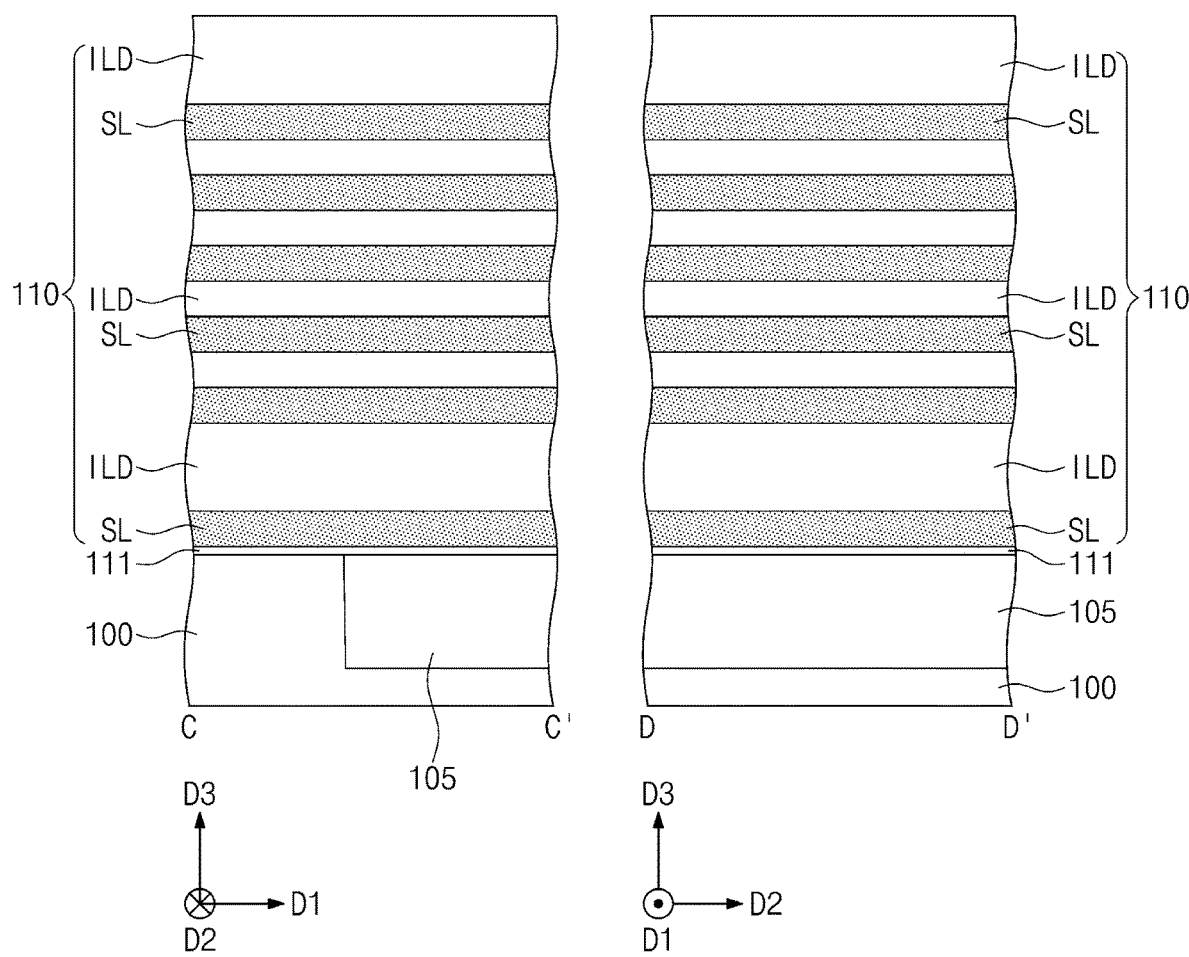
FIGS. 12D, 13D, 14D, 15D, and 16D illustrate cross-sectional views taken along lines C-C' and D-D' of FIGS. 12A, 13A, 14A, 15A, and 16A, respectively.
Figure 13A:
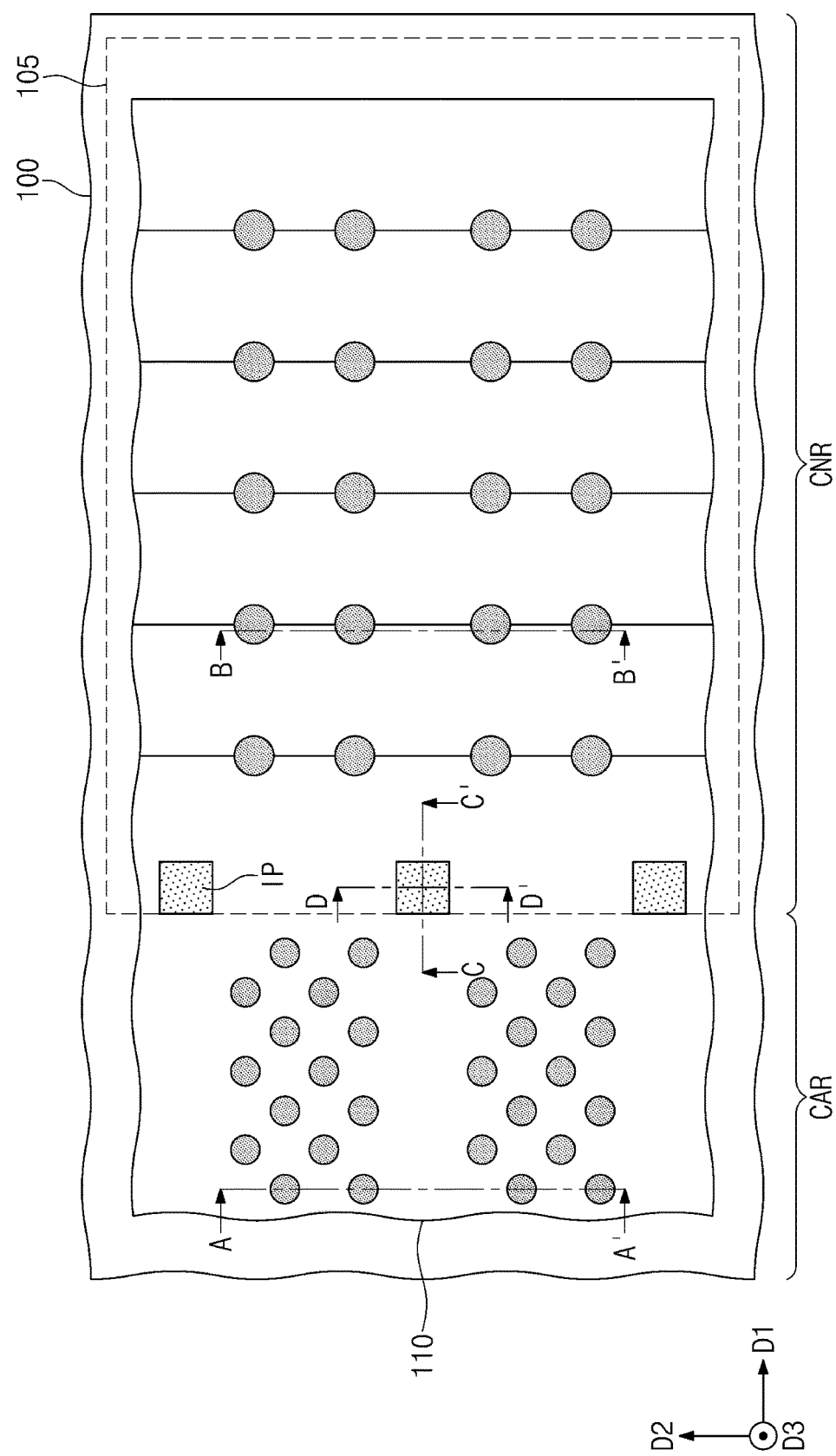
Figure 13B:
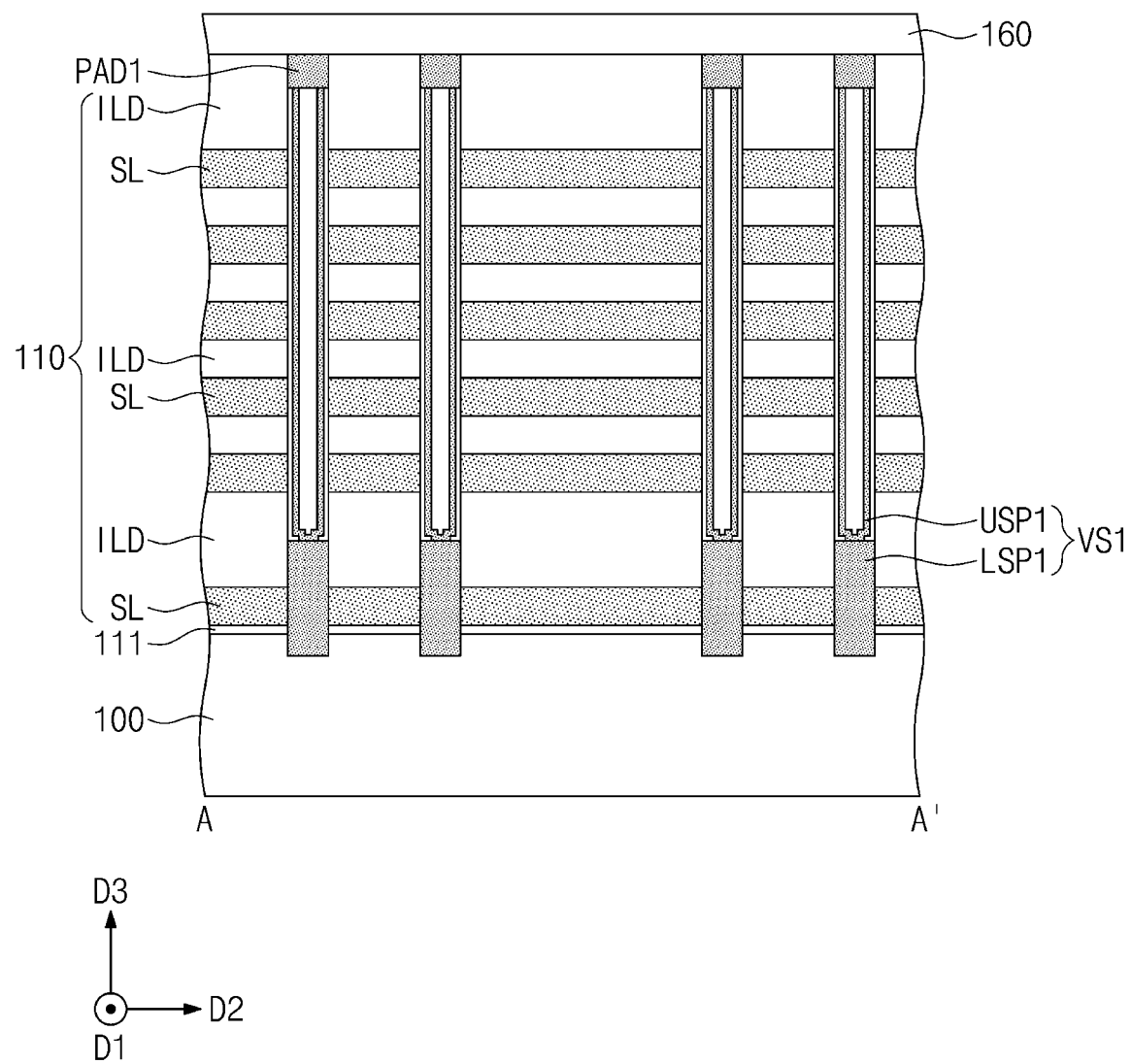
Figure 13C:
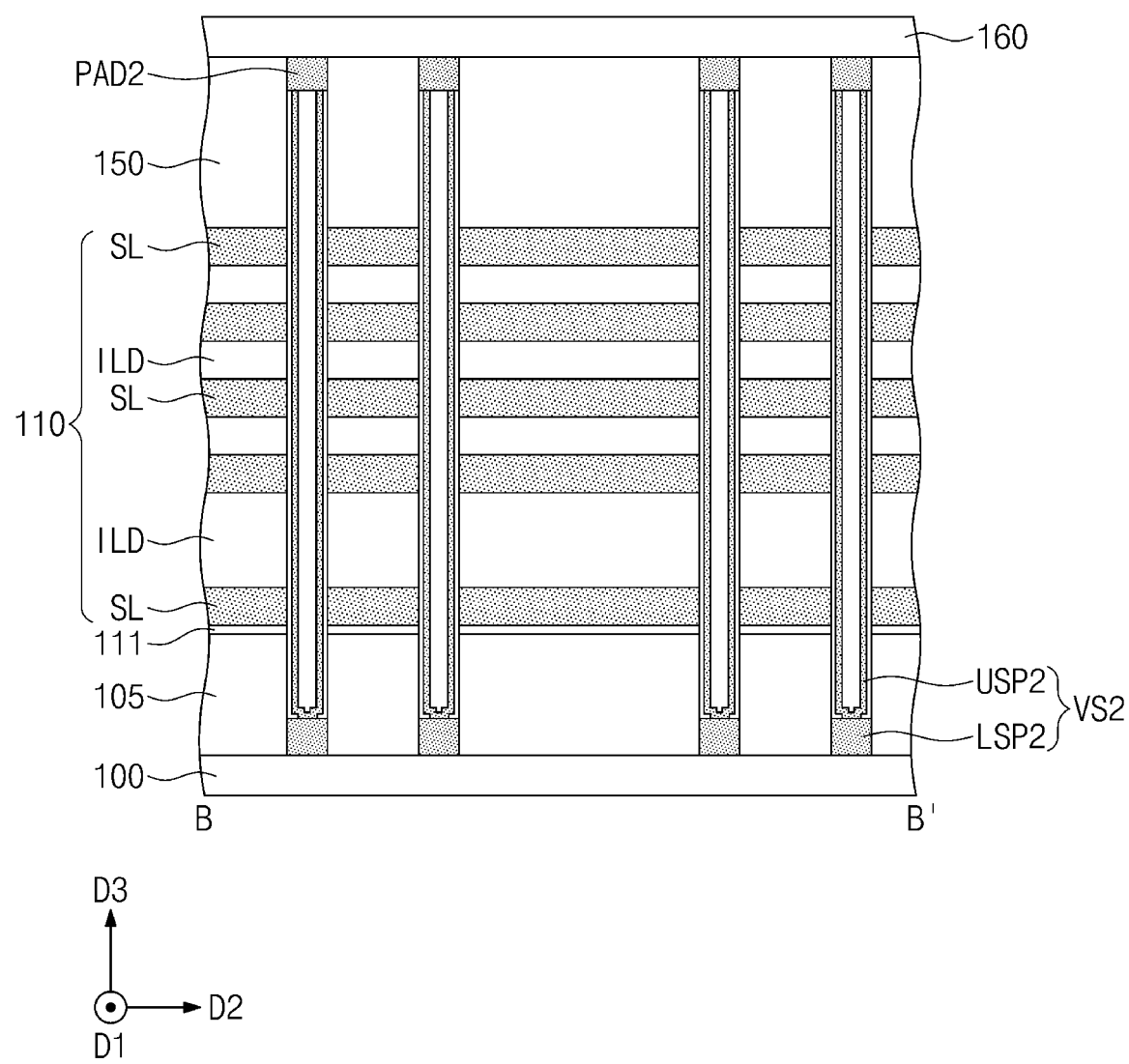
Figure 13D:
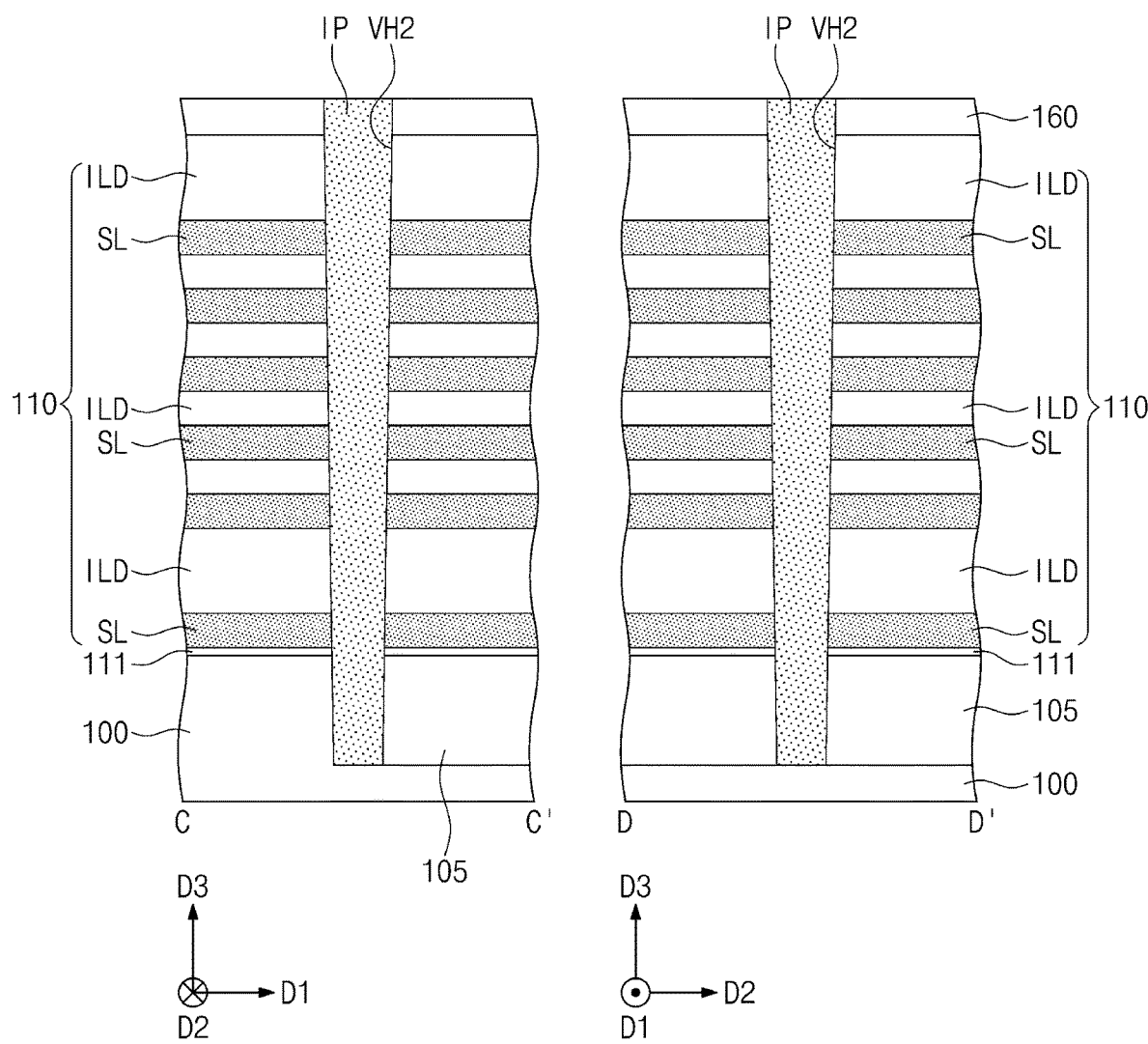
Figure 14A:
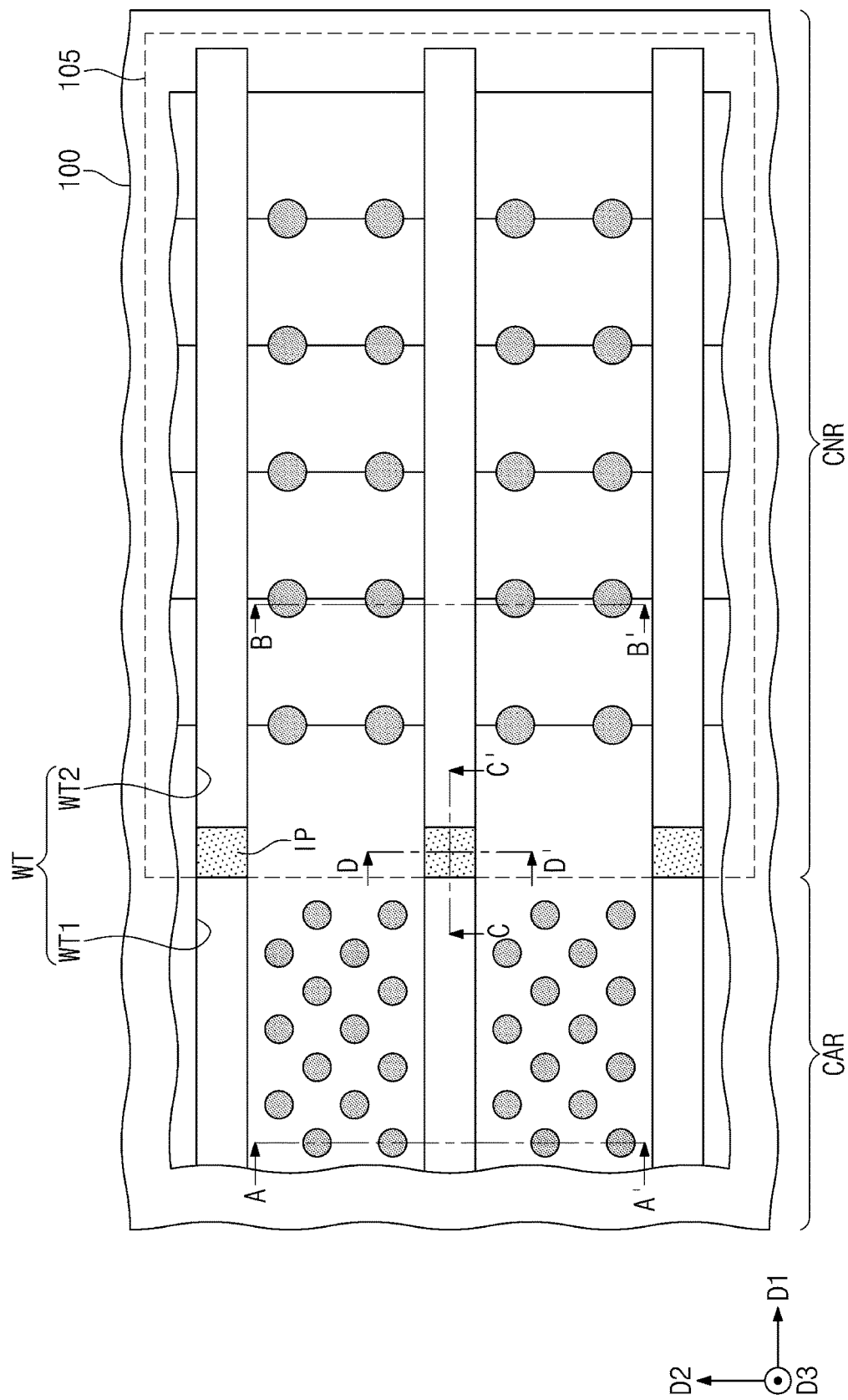
Figure 14B:
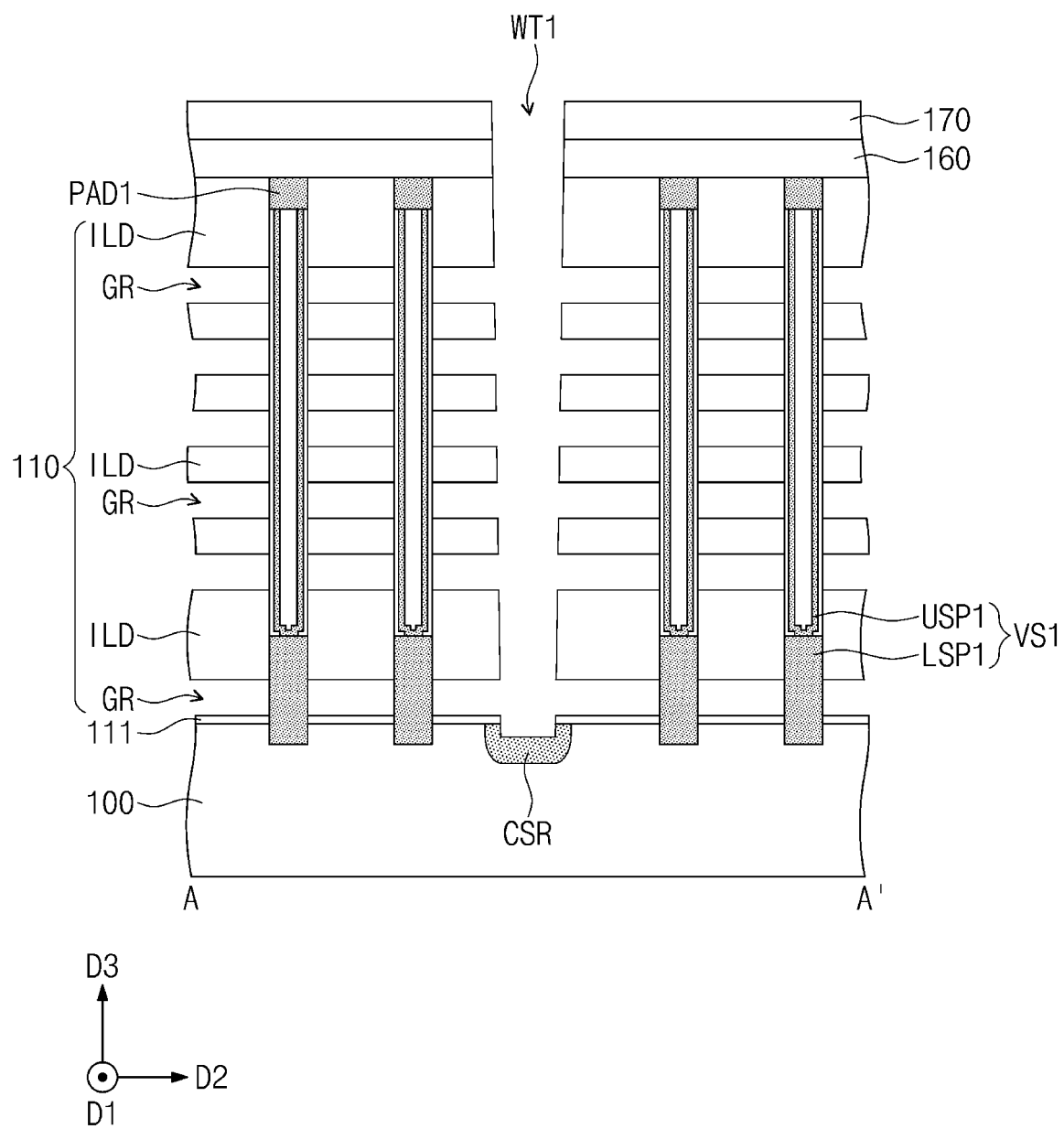
Figure 14C:
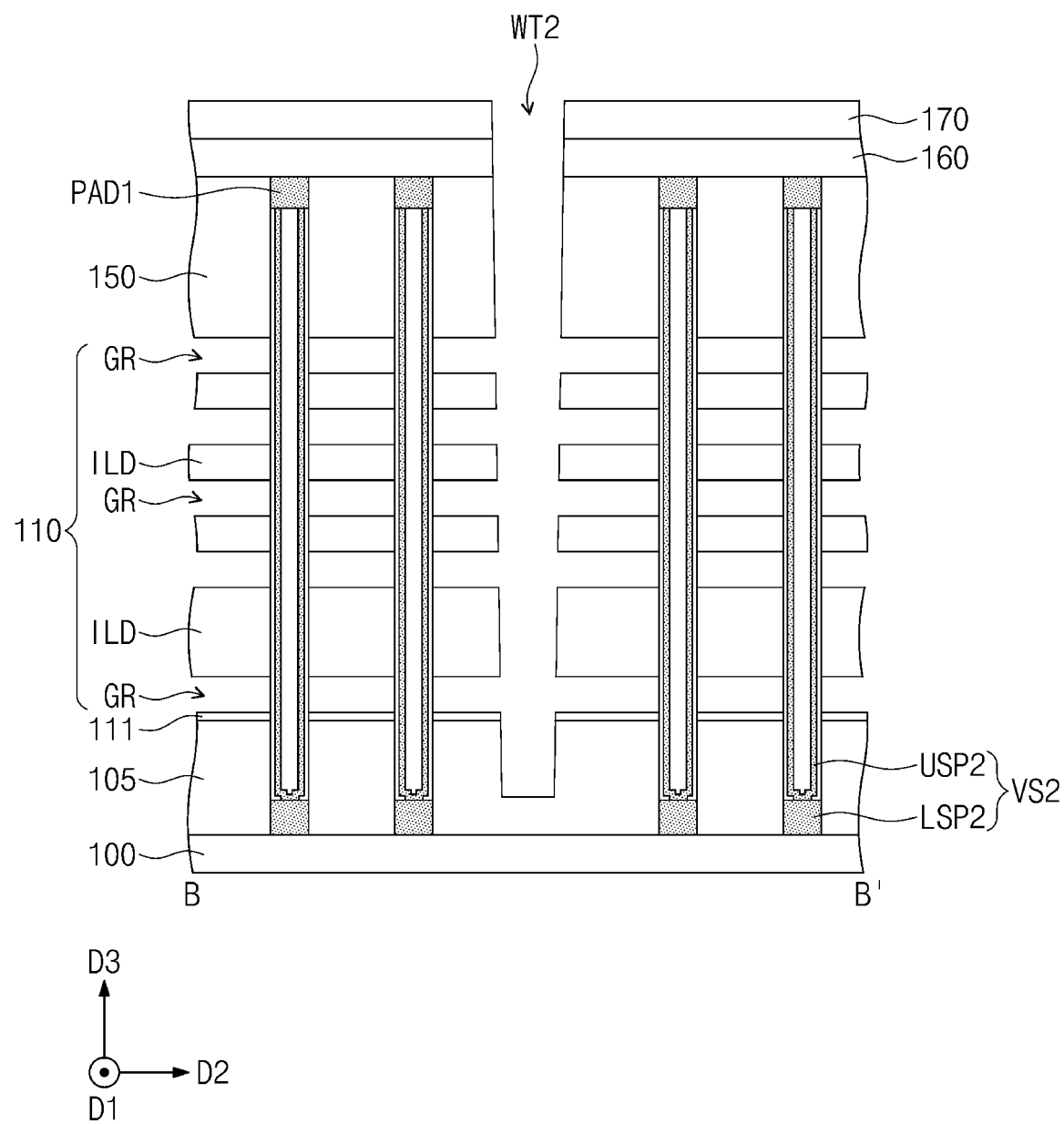
Figure 14D:
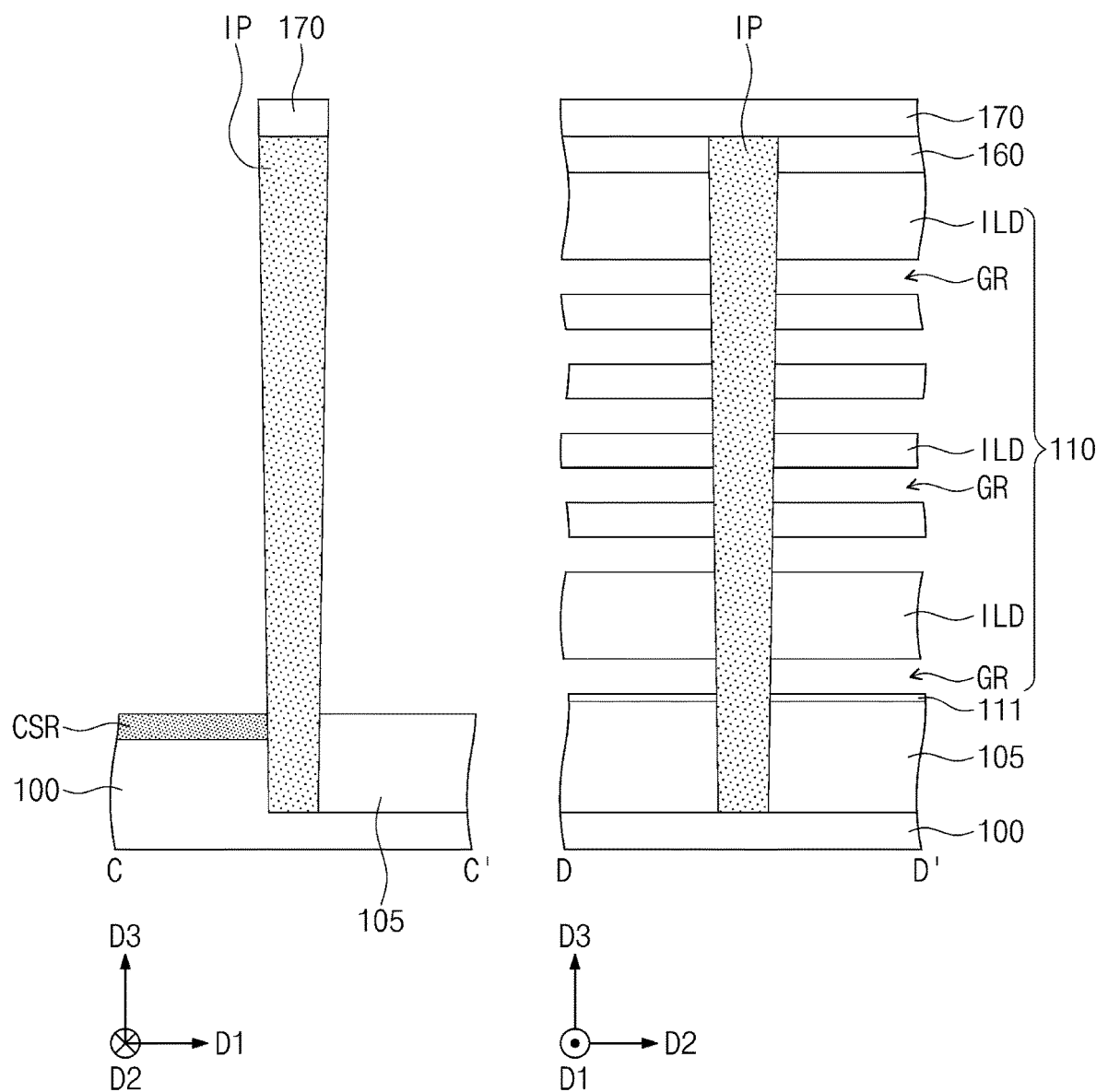
Figure 15A:
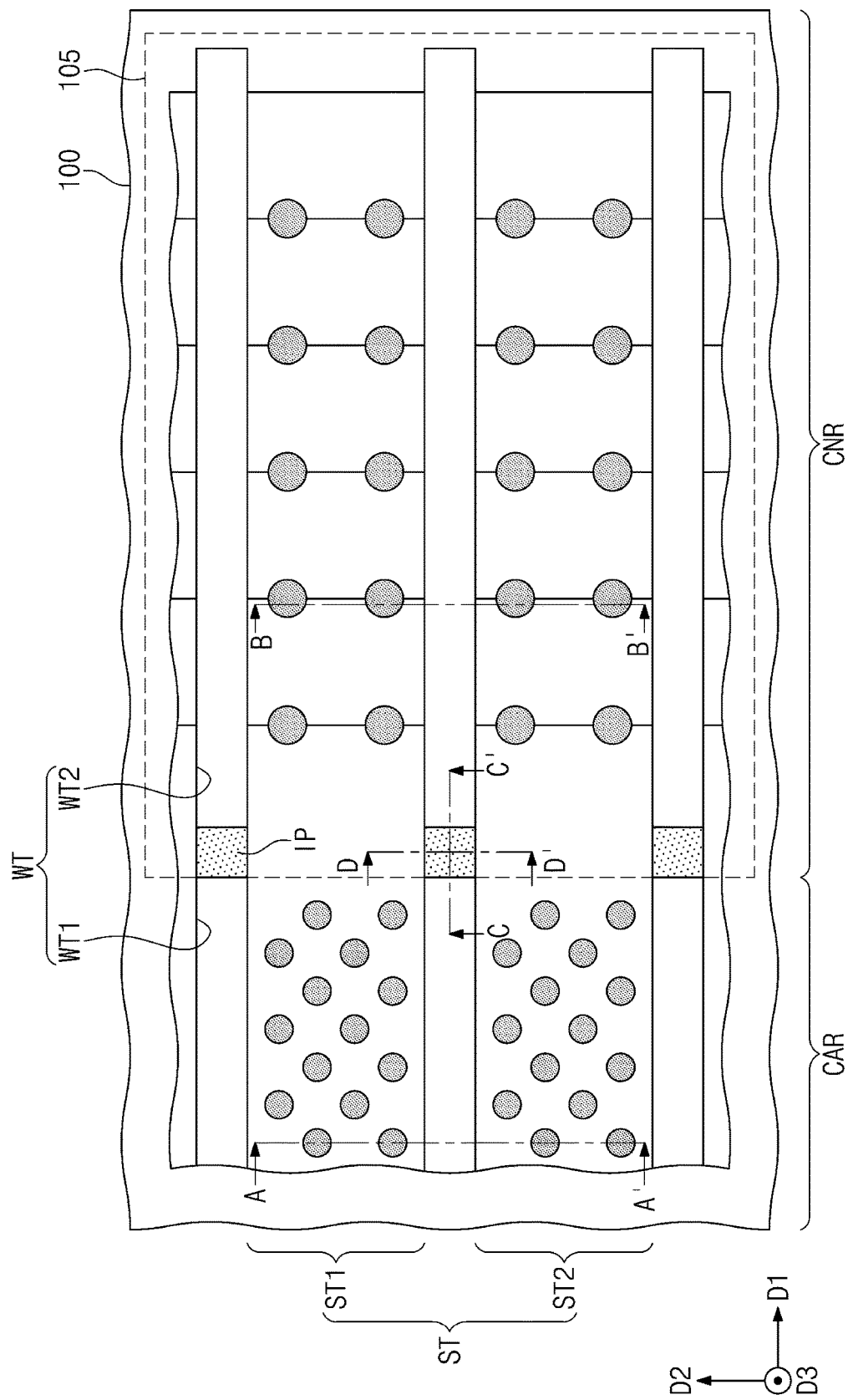
Figure 15B:
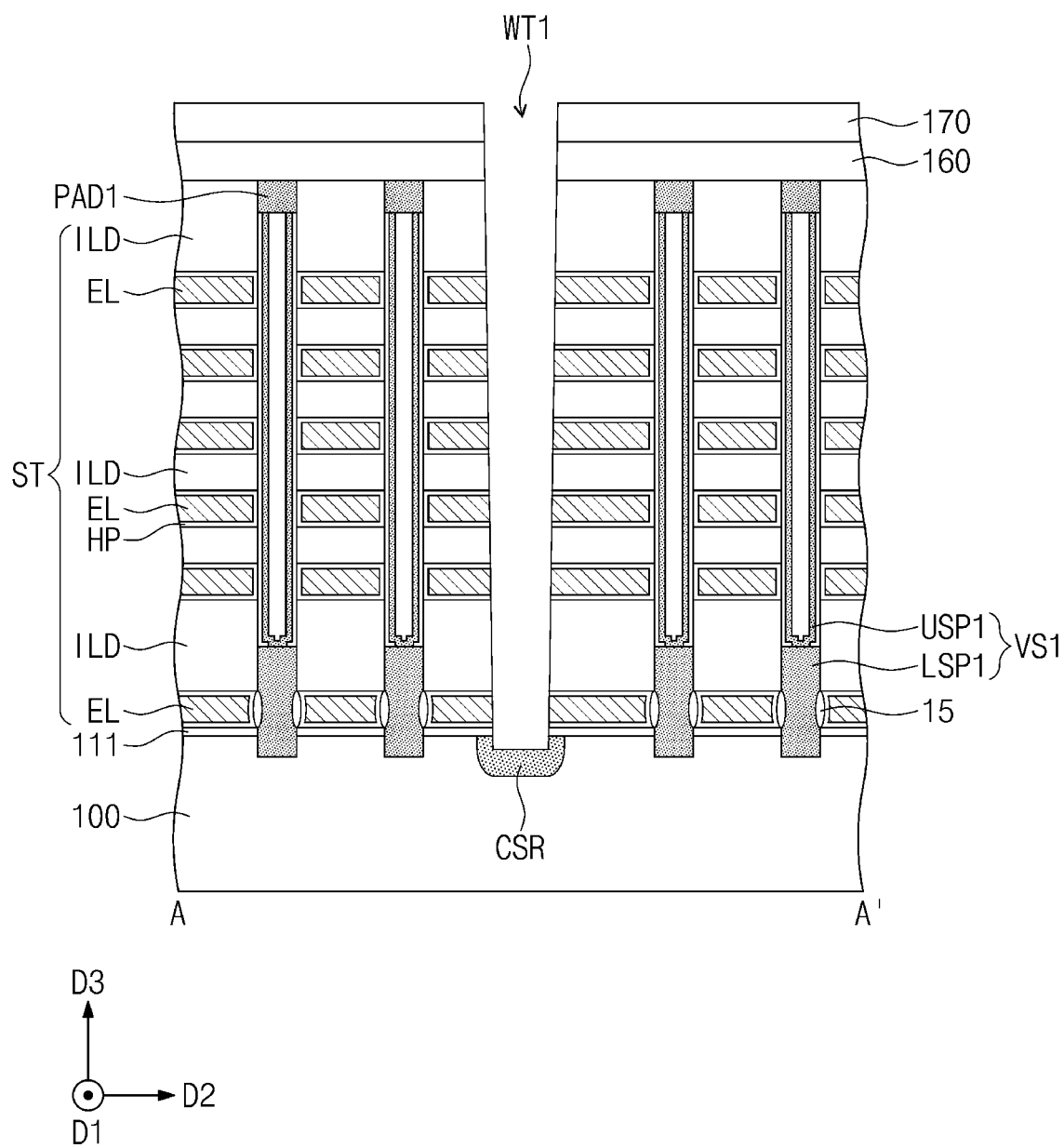
Figure 15C:
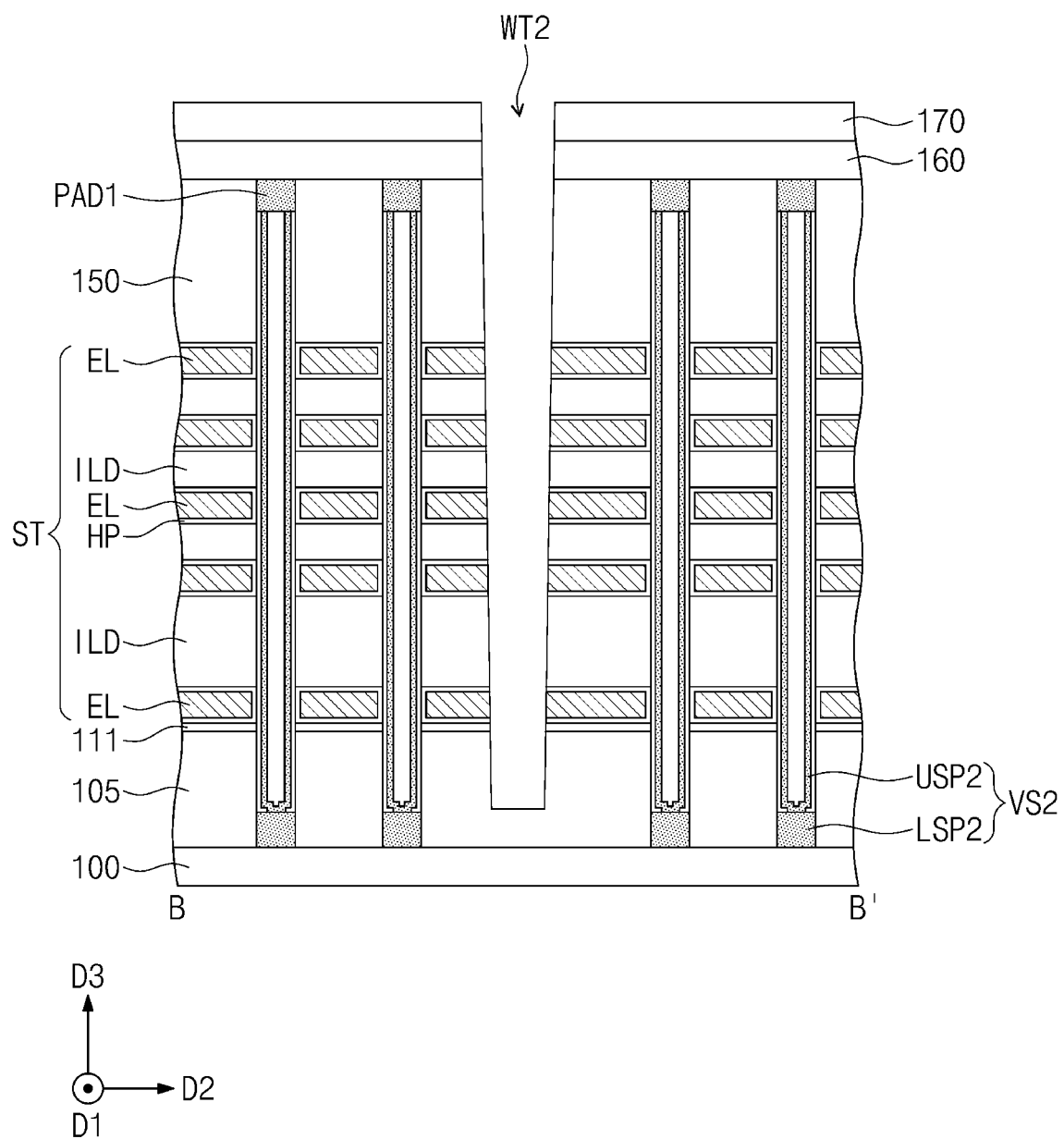
Figure 15D:
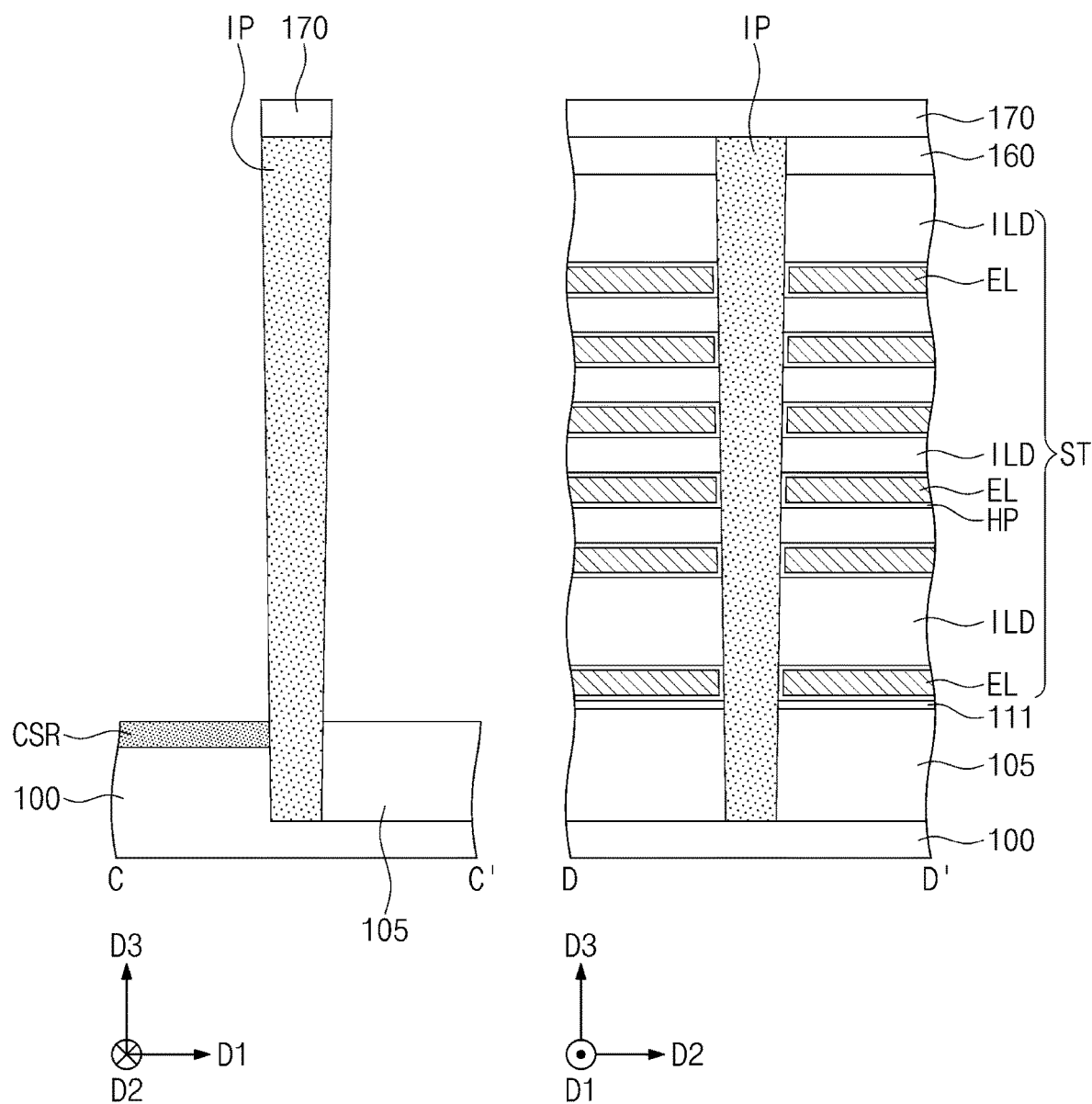
Figure 16B:
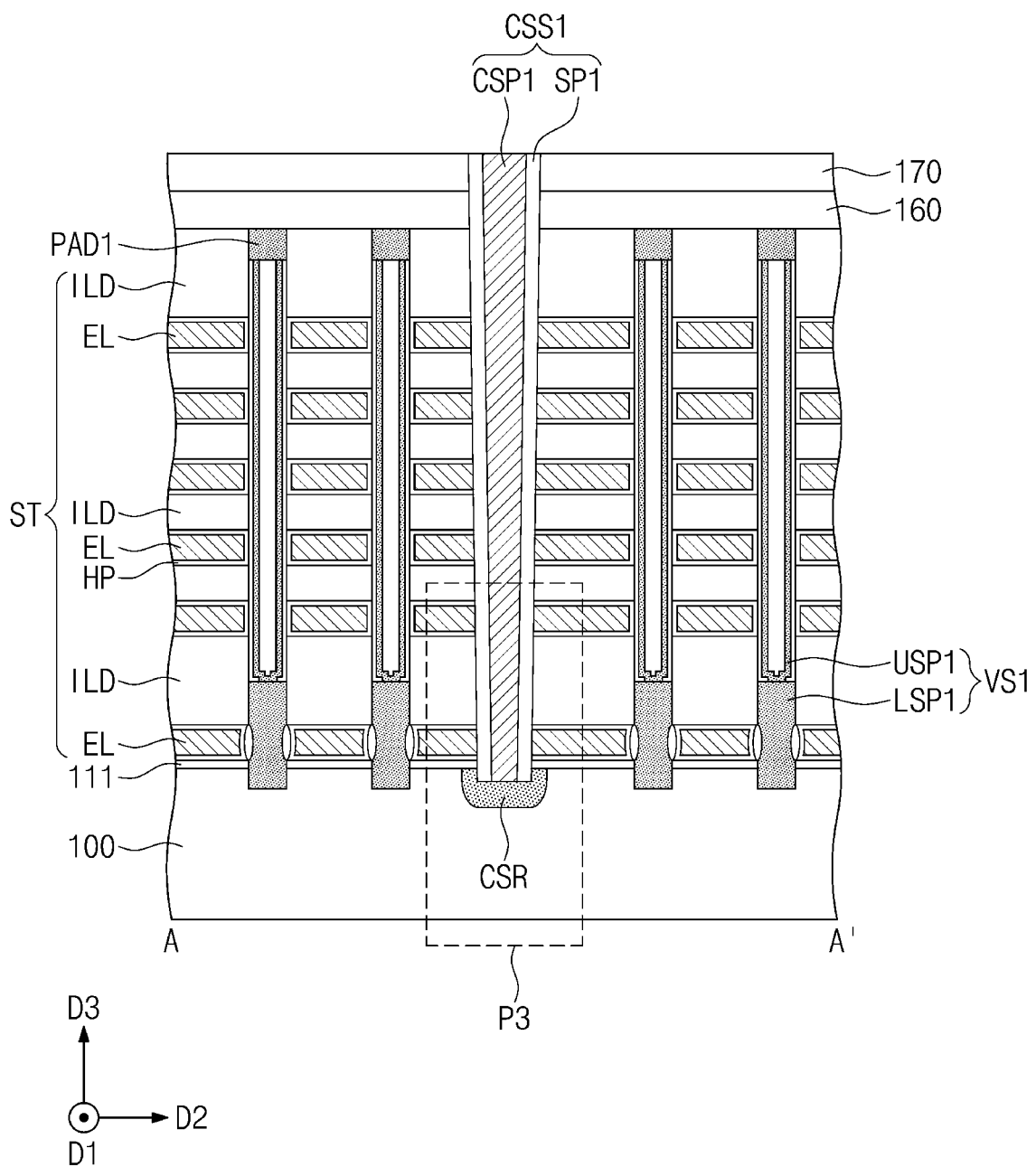
Figure 16C:
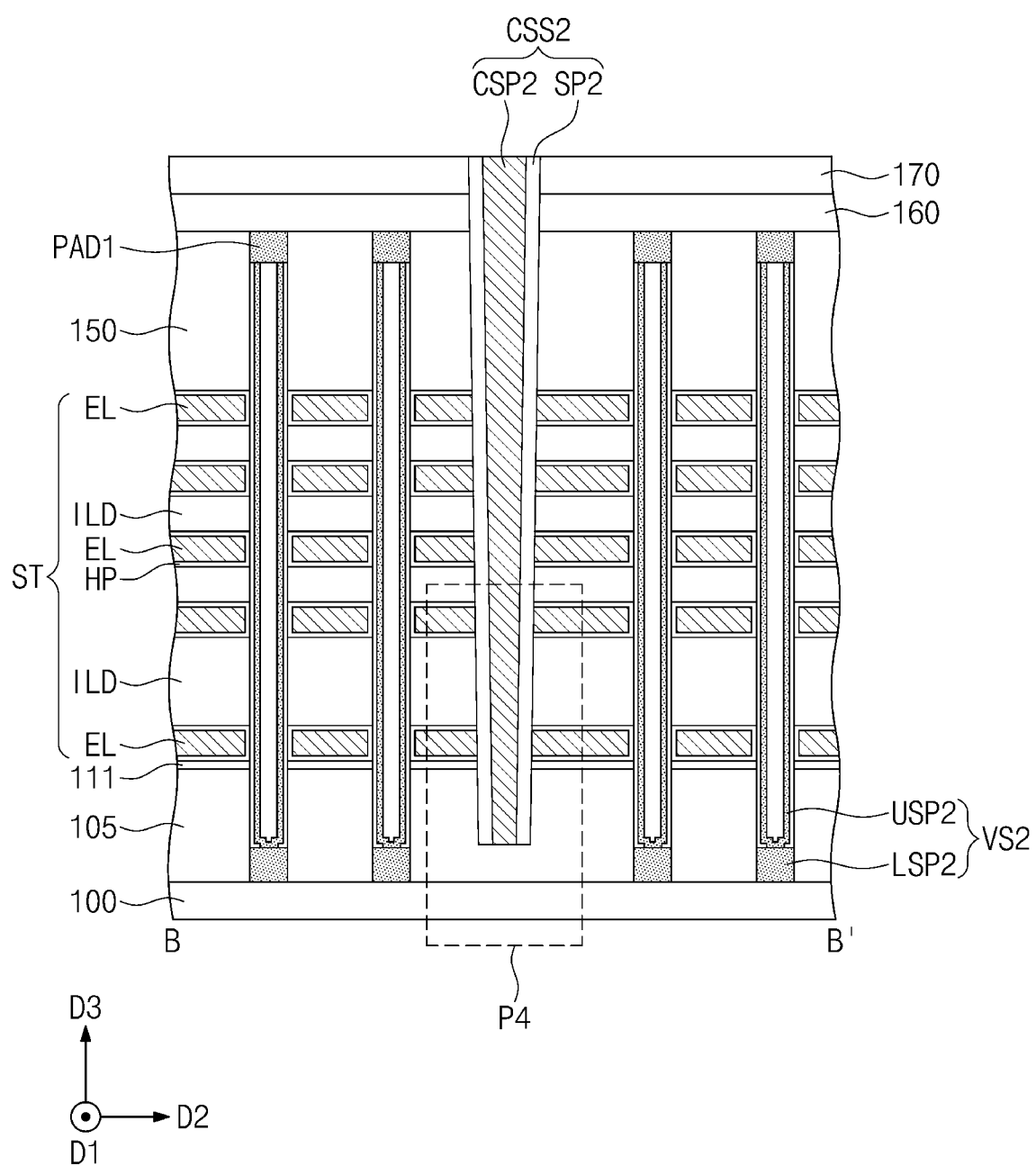
Figure 16D:
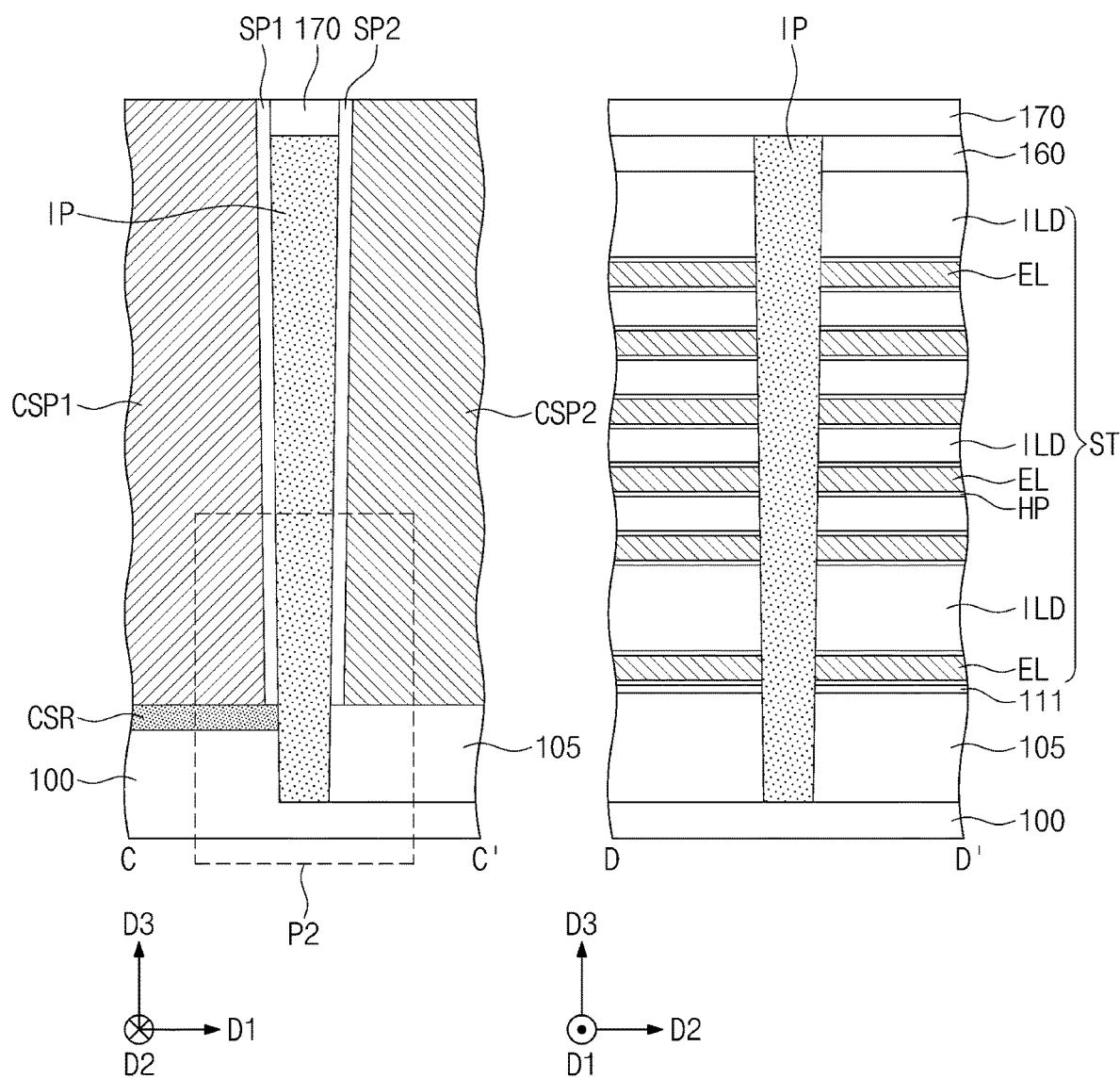

FIG. 10 illustrates a plan view showing a three-dimensional semiconductor memory device according to some example embodiments of inventive concepts. FIG. 11 illustrates a cross-sectional view taken along lines A-A' and B-B' of FIG. 10, showing a three-dimensional semiconductor memory device according to some example embodiments of inventive concepts.

For brevity of description, the following discussion may omit the technical features the same as those of the three-dimensional semiconductor memory device discussed above.

Referring to FIGS. 10 and 11, an electrode connection ECP may be provided between the stack structures ST. For example, the electrode connection ECP may be disposed between the first and second stack structures ST1 and ST2. The electrode connection ECP may connect the first and second stack structures ST1 and ST2 to each other. The electrode connection ECP may be provided, for example, on the connection region CNR.

For example, the electrode connection ECP may horizontally connect the electrodes EL located at the same level from the substrate 100. The electrode connection ECP may also connect the insulation layers ILD located at the same level from the substrate 100. The electrode connection ECP may provide the same potential to the electrodes EL at the same level in the first and second stack structures ST1 and ST2. In some example embodiments, at least one of the second common source structures CSS2 may be separated by the electrode connection ECP. For example, at least one of the second source structures CSS2 may include a plurality of second common source plugs CSP2 spaced apart from each other in the first direction D1 across the electrode connection ECP. Further, the at least one of the second source structures CSS2 may include a plurality of second dielectric spacers SP2 that surround corresponding second common source plugs CSP2.

Figure 17A:
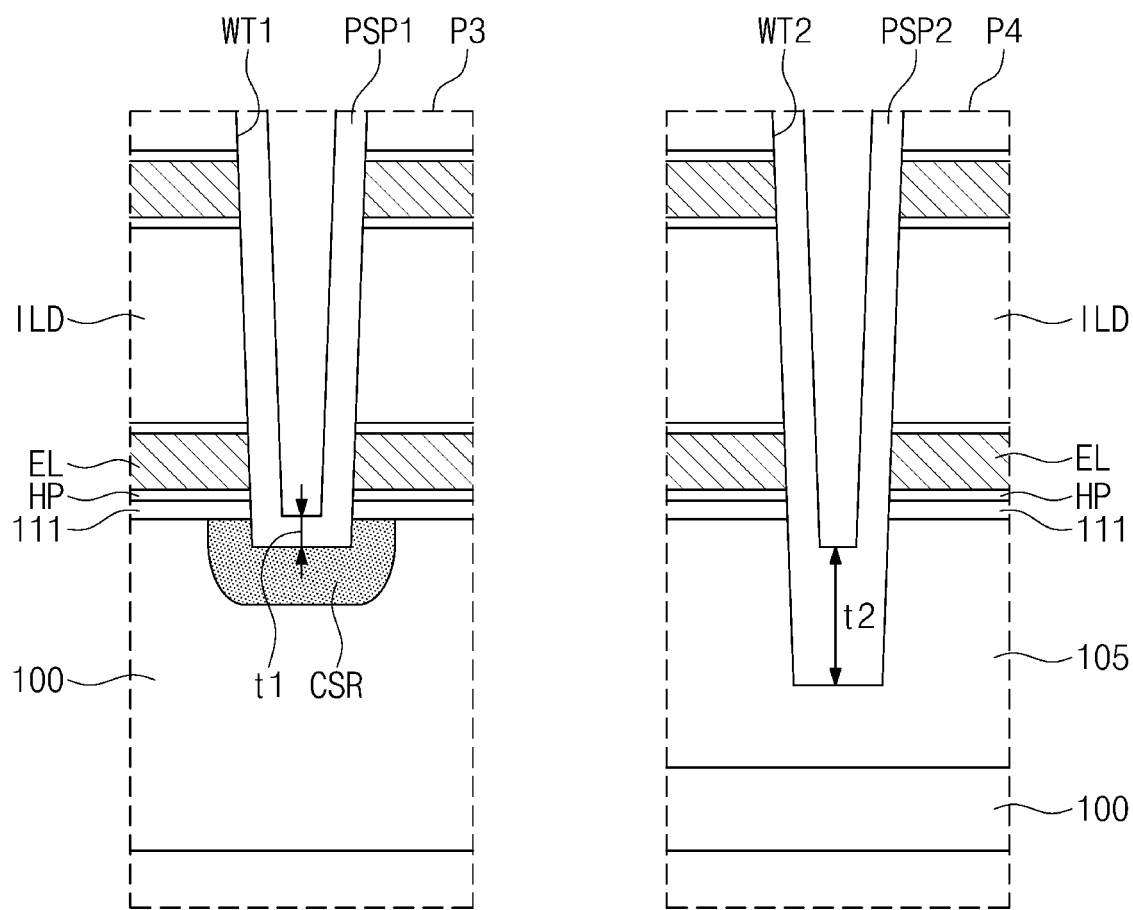
FIGS. 17A, 17B, and 17C illustrate cross-sectional views each illustrating sections P3 and P4 of FIGS. 16B and 16C, respectively, showing a method of manufacturing a three-dimensional semiconductor memory device, according to some example embodiments of inventive concepts.
Figure 17B:
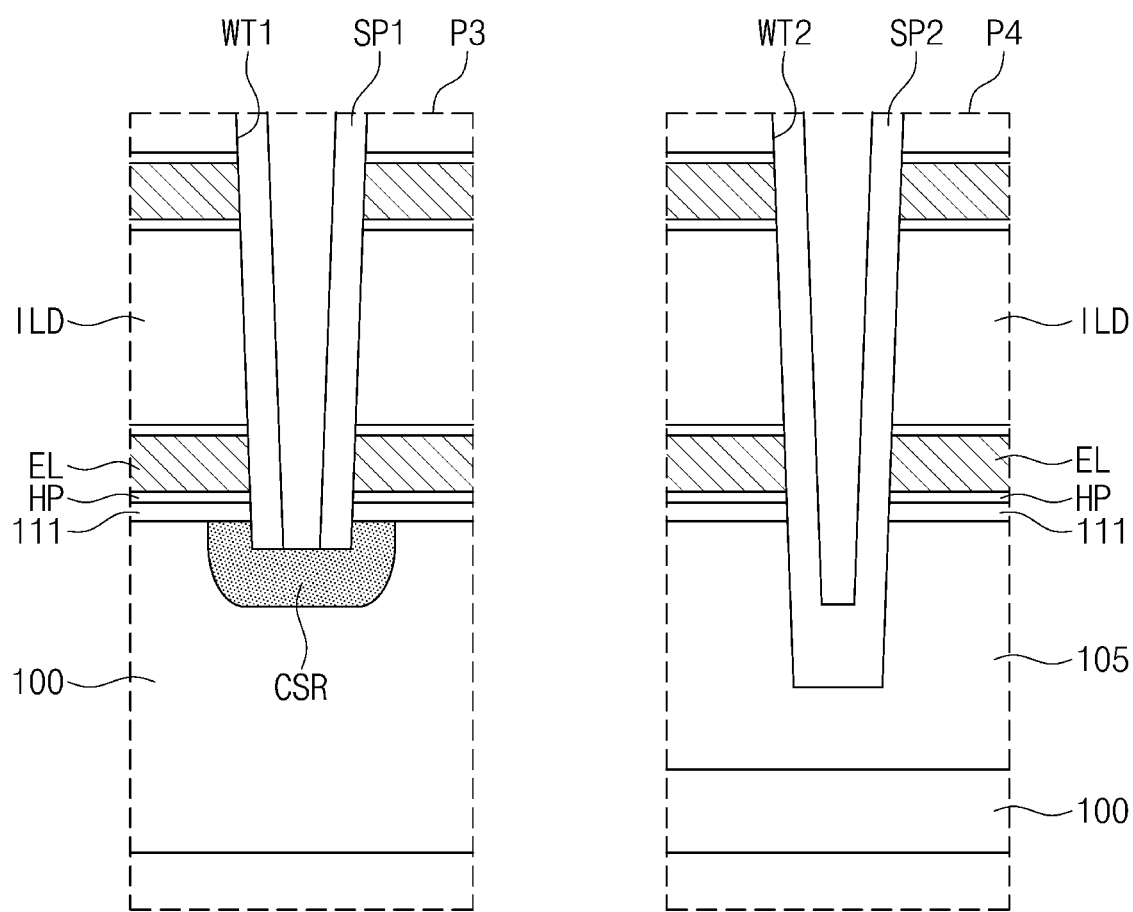
Figure 17C:
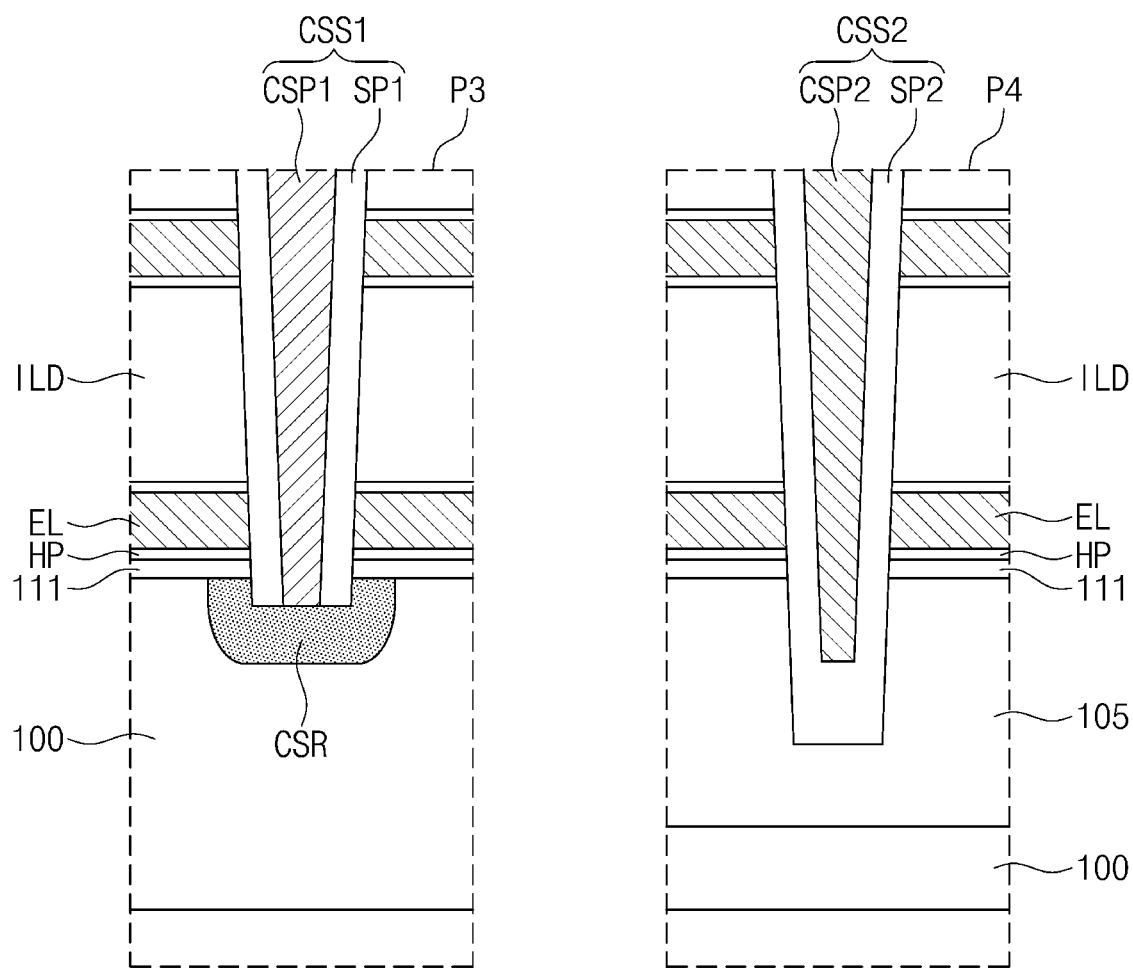

FIGS. 12A, 13A, 14A, 15A, and 16A illustrate plan views showing a method of manufacturing a three-dimensional semiconductor memory device, according to some example embodiments of inventive concepts. FIGS. 12B, 13B, 14B, 15B, and 16B illustrate cross-sectional views taken along line A-A' of FIGS. 12A, 13A, 14A, 15A, and 16A, respectively. FIGS. 12C, 13C, 14C, 15C, and 16C illustrate cross-sectional views taken along line B-B' of FIGS. 12A, 13A, 14A, 15A, and 16A, respectively. FIGS. 12D, 13D, 14D, 15D, and 16D illustrate cross-sectional views taken along lines C-C' and D-D' of FIGS. 12A, 13A, 14A, 15A, and 16A, respectively. FIGS. 17A, 17B, and 17C illustrate cross-sectional views each illustrating sections P3 and P4 of FIGS. 16B and 16C, respectively, showing a method of manufacturing a three-dimensional semiconductor memory device, according to some example embodiments of inventive concepts.

Referring to FIGS. 12A to 12D, a mold structure 110 may be formed on a substrate 100, and first and second vertical channel structures VS1 and VS2 may be formed to penetrate the mold structure 110.

A dielectric pattern 105 may be formed on the substrate 100. The formation of the dielectric pattern 105 may include forming a trench T on a connection region CNR of the substrate 100, and filling the trench T with an insulating material. The substrate 100 may have a single crystalline or polycrystalline structure and may include silicon. The substrate 100 may be doped with impurities of a first conductivity. The first conductivity may be, for example, P-type.

In some example embodiments, the dielectric pattern 105 may be formed entirely on the connection region CNR of the substrate 100. Alternatively, the dielectric pattern 105 may be formed partially on the connection region CNR of the substrate 100. When the dielectric pattern 105 is formed partially on the connection region CNR of the substrate 100, the dielectric pattern 105 may have a linear shape as discussed above with reference to FIGS. 6, 7A, and 7B.

The mold structure 110 may be formed on the connection region CNR and also on a cell array region CAR of the substrate 100. The formation of the mold structure 110 may include forming on an entire surface of the substrate 100 a thin-layer structure in which sacrificial layers SL and insulation layers ILD are vertically and alternately stacked, and then performing a trimming process on the thin-layer structure. The trimming process may cause the mold structure 110 to have a stepwise structure on the connection region CNR. After the mold structure 110 is formed, a planarized dielectric layer 150 may be formed on the entire surface of the substrate 100. The planarized dielectric layer 150 may have a substantially flat top surface and may be formed of an insulating material having an etch selectivity with respect to the sacrificial layers SL. Before the mold structure 110 is formed, a buffer dielectric layer 111 may be formed on the entire surface of the substrate 100.

The first and second vertical channel structures VS1 and VS2 may be formed. The first and second vertical channel structures VS1 and VS2 may be formed in first vertical holes VH1 that penetrate the mold structure 110 and the planarized dielectric layer 150 and expose the substrate 100.

For example, the first vertical holes VH1 may be formed by performing an anisotropic etching process on the mold structure 110 and the planarized dielectric layer 150. A top surface of the substrate 100 on the cell array region CAR may be over-etched when the first vertical holes VH1 are formed. The top surface of the substrate 100 exposed to the first vertical holes VH1 may thus be recessed to a certain depth. When the anisotropic etching process is performed, the substrate 100 and the dielectric pattern 105 may be different from each other in terms of an etch rate. Therefore, bottom surfaces of the first vertical holes VH1 on the connection region CNR may be located at a level lower than that of bottom surfaces of the first vertical holes VH1 on the cell array region CAR.

First and second lower semiconductor patterns LSP1 and LSP2 may be formed to fill portions of the first vertical holes VH1 by performing a selective epitaxial growth (SEG) process in which the substrate 100 exposed to the first vertical holes VH1 is used as a seed layer. First and second vertical dielectric patterns VP1 and VP2, first and second upper semiconductor patterns USP1 and USP2, and first and second buried dielectric patterns VI1 and VI2 may be formed in remaining portions of the first vertical holes VH1. The first and second lower semiconductor patterns LSP1 and LSP2 may be formed to have pillar shapes that fill lower portions of the first vertical holes VH1. Alternatively, the first and second lower semiconductor patterns LSP1 and LSP2 may not be formed. A bit line conductive pad PAD1 may be formed on a top end of each of the first upper semiconductor patterns USP1, and a dummy conductive pad PAD2 may be formed on a top end of each of the second upper semiconductor patterns USP2.

Referring to FIGS. 13A to 13D, a first interlayer dielectric layer 160 may be formed on the planarized dielectric layer 150, covering top surfaces of the first and second vertical channel structures VS1 and VS2. One or more vertical dielectric structures IP may be formed to penetrate the first interlayer dielectric layer 160, the planarized dielectric layer 150, and the mold structure 110.

For example, second vertical holes VH2 may be formed to penetrate the first interlayer dielectric layer 160, the planarized dielectric layer 150, and the mold structure 110. An anisotropic etching process may be performed to form the second vertical holes VH2. The second vertical holes VH2 may expose bottom and inner surfaces of the trench T of the substrate 100. The vertical dielectric structures IP may be formed in the second vertical holes VH2. The vertical dielectric structure IP may be formed of an insulating material having an etch selectivity with respect to the sacrificial layers SL.

Referring to FIGS. 14A to 14D, separation trenches WT may be formed, and the sacrificial layers SL may be removed. Before the separation trenches WT are formed, a second interlayer dielectric layer 170 may be formed on the first interlayer dielectric layer 160 and may cover a top surface of the vertical dielectric structure IP.

For example, the separation trenches WT may be formed to penetrate the first interlayer dielectric layer 160, the second interlayer dielectric layer 170, the planarized dielectric layer 150, and the mold structure 110, while exposing the substrate 100. The formation of the separation trenches WT may include forming on the second interlayer dielectric layer 170 a mask pattern (not shown) defining planar positions of the separation trenches WT, and then using the mask pattern as an etching mask to anisotropically etch the mold structure 110. The separation trenches WT may extend in a first direction D1 and may be spaced apart from each other in a second direction D2 intersecting the first direction D1.

Each of the separation trenches WT may include a first separation trench WT1 on the cell array region CAR and a second separation trench WT2 on the connection region CNR. The first and second separation trenches WT1 and WT2 may be spaced apart in the first direction D1 from each other across the vertical dielectric structure IP. The top surface of the substrate 100 exposed to the first separation trench WT1 may be recessed to a certain depth. The dielectric pattern 105 exposed to the second separation trench WT2 may be etched when the top surface of the substrate 100 is over-etched. Because the substrate 100 and the dielectric pattern 105 are different in etch rate, the second separation trench WT2 may have a bottom surface at a level lower than that of a bottom surface of the first separation trench WT1.

Gate regions GR may be formed between the insulation layers ILD by removing the sacrificial layers SL whose sidewalls are exposed to the separation trenches WT. For example, the gate regions GR may be areas from which the sacrificial layers SL are removed. The gate regions GR may partially expose sidewalls of the first and second vertical channel structures VS1 and VS2.

Referring to FIGS. 15A to 15D, a gate dielectric layer 15 may be formed on a sidewall of the first lower semiconductor pattern LSP1 exposed to a lowermost one of the gate regions GR. The gate dielectric layer 15 may be formed by performing a heat treatment process under a gas atmosphere including oxygen atoms. Thus, the sidewall of the first lower semiconductor pattern LSP1 exposed to the gate region GR may be thermally oxidized to form the gate dielectric layer 15.

Electrodes EL may be formed in the gate regions GR by sequentially depositing a horizontal dielectric layer, a barrier metal layer, and a metal layer on the mold structure 110 in which the gate regions GR are formed, and then anisotropically etching the barrier metal layer and the metal layer that are deposited on inner walls of the separation trenches WT. The horizontal dielectric layer may include a silicon oxide layer and/or a high-k dielectric layer that correspond to a portion of a data storage layer. The barrier metal layer may include a metal nitride layer such as TiN, TaN, or WN. The metal layer may include metal such as W, Al, Ti, Ta, Co, or Cu. The horizontal layer may be formed into a horizontal dielectric pattern HP disposed in each of the gate regions GR.

Because the sacrificial layers SL of the mold structure 110 are replaced with the electrodes EL, a stack structure ST may be formed to include the electrodes EL and the insulation layers ILD that are vertically and alternately stacked as discussed with reference to FIGS. 2 and 3A.

Common source regions CSR may be formed in the substrate 100 between the stack structures ST. The dielectric pattern 105 may cover the substrate 100 on the connection region CNR, and thus the common source regions CSR may be selectively formed on the cell array region CAR of the substrate 100. The common source regions CSR may extend in parallel in the first direction D1 and may be spaced apart from each other in the second direction D2. The common source regions CSR may be formed by doping the substrate 100 with impurities whose conductivity is different from that of the substrate 100.

Referring to FIGS. 16A to 16D, first and second dielectric spacers SP1 and SP2 may be formed to cover the inner walls of the separation trenches WT. The first dielectric spacers SP1 may be formed in the first separation trenches WT1. The second dielectric spacers SP2 may be formed in the second separation trenches WT2. The formation of the first and second dielectric spacers SP1 and SP2 may include depositing a spacer layer to have a uniform thickness on the substrate 100 on which the stack structures ST are formed, and performing an etch-back process on the spacer layer to expose the common source regions CSR. The spacer layer may be formed of an insulating material. The spacer layer may include, for example, silicon oxide, silicon nitride, silicon oxynitride, or a low-k dielectric material having a low dielectric constant.

First and second common source plugs CSP1 and CSP2 may be formed in the separation trenches WT in which the first and second dielectric spacers SP1 and SP2 are formed. The first common source plug CSP1 may be formed in the first separation trench WT1 in which the first dielectric spacer SP1 is formed. The first common source plug CSP1 may penetrate the first dielectric spacer SP1 and contact the common source region CSR of the substrate 100. The second common source plug CSP2 may be formed in the second separation trench WT2 in which the second dielectric spacer SP2 is formed. The second common source plug CSP2 may penetrate the second dielectric spacer SP2 and contact the dielectric pattern 105 in the trench T of the substrate 100.

In some example embodiments, as shown in FIGS. 17A to 17C, a common source structure CSS may be formed to leave the second dielectric spacer SP2 below the second common source plug CSP2.

For example, as shown in FIG. 17A, a first spacer layer PSP1 may be formed in the first separation trench WT1. A second spacer layer PSP2 may be formed in the second separation trench WT2. Each of the first and second spacer layers PSP1 and PSP2 may be a portion of the spacer layer conformally formed on the inner wall of the separation trench WT. The bottom surface of the second separation trench WT2 may have a width less than that of the bottom surface of the first separation trench WT1. Therefore, the second spacer layer PSP2 may have a lower segment whose thickness t2 is greater than a thickness t1 of a lower segment of the first spacer layer PSP1.

As shown in FIG. 17B, the first and second spacer layers PSP1 and PSP2 may experience an etch-back process to form the first and second dielectric spacers SP1 and SP2. When the etch-back process is performed, the lower segment of the second spacer layer PSP2 may not be penetrated, or may be incompletely removed, due to a difference in thickness between the lower segments of the first and second spacer layers PSP1 and PSP2. For example, the dielectric pattern 105 on the connection region CNR may not be exposed by the second spacer layer PSP2.

As shown in FIG. 17C, the first common source plug CSP1 and the second common source plug CSP2 may be respectively formed in the first separation trench WT1 and the second separation trench WT2. The second common source plug CSP2 may not penetrate the second dielectric spacer SP2 and may have a bottom surface spaced apart from the dielectric pattern 105. In some example embodiments, as discussed with reference to FIGS. 8, 9A, and 9B, the second separation trench WT2 may have a width in the second direction D2 less than a width in the second direction D2 of the first separation trench WT1, and as a result, the second dielectric spacer SP2 may easily remain below the second common source plug CSP2.

According to inventive concepts, a three-dimensional semiconductor memory device may be provided to have increased reliability and integration. Furthermore, when an erase or program mode is operated, it may be possible to limit and/or prevent the occurrence of failure caused by a difference in voltage between a common source plug and a word line.

Although inventive concepts have been described in connection with some example embodiments illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of inventive concepts.

What is claimed is:

1. A three-dimensional semiconductor memory device, comprising:
   a substrate;
   a first stack structure and a second stack structure adjacent to each other on the substrate, each of the first stack structure and the second stack structure including a plurality of insulation layers and a plurality of electrodes alternately stacked on the substrate;
   a first common source plug between the first stack structure and the second stack structure, the first common source plug being connected to the substrate;
   a second common source plug between the first stack structure and the second stack structure, the second common source plug being spaced apart from the substrate; and
   a vertical dielectric structure between the first common source plug and the second common source plug.

2. The three-dimensional semiconductor memory device of claim 1, wherein
   the first stack structure and the second stack structure extend in a first direction parallel to a top surface of the substrate,
   the first stack structure and the second stack structure are spaced apart from each other in a second direction intersecting the first direction,
   the first common source plug and the second common source plug extend in the first direction, and
   the first common source plug and the second common source plug respectively face a lateral surface of the first stack structure and a lateral surface of the second stack structure.

3. The three-dimensional semiconductor memory device of claim 2, wherein
   the first common source plug and the second common source plug are spaced apart in the first direction from each other across the vertical dielectric structure.

4. The three-dimensional semiconductor memory device of claim 1, further comprising:
   a plurality of vertical channel structures penetrating the first stack structure and the second stack structure; and
   a bit line connecting the plurality of vertical channel structures to each other, wherein
   the first common source plug is located below the bit line.

5. The three-dimensional semiconductor memory device of claim 1, further comprising:

a dielectric pattern filling a trench in the substrate, wherein at least a portion of the dielectric pattern is between the second common source plug and the substrate.

6. The three-dimensional semiconductor memory device of claim 5, further comprising:

a dielectric spacer surrounding the second common source plug, wherein a portion of the dielectric spacer is located below a bottom surface of the second common source plug.

7. The three-dimensional semiconductor memory device of claim 1, wherein a bottom surface of the vertical dielectric structure is located at a level lower than a bottom surface of the first common source plug and a bottom surface of the second common source plug.

8. The three-dimensional semiconductor memory device of claim 1, wherein a top surface of the vertical dielectric structure is located at a level lower than a top surface of the first common source plug and a top surface of the second common source plug.

9. The three-dimensional semiconductor memory device of claim 1, wherein a bottom surface of the second common source plug is located at a level lower a bottom surface of the first common source plug.

10. The three-dimensional semiconductor memory device of claim 1, wherein the first stack structure and the second stack structure extend in a first direction parallel to a top surface of the substrate, the first stack structure and the second stack structure are spaced apart from each other in a second direction intersecting the first direction, a width in the second direction of a top surface of the second common source plug is less than a width in the second direction of a top surface of the first common source plug.

11. The three-dimensional semiconductor memory device of claim 1, further comprising:

an electrode connection between the first stack structure and the second stack structure, wherein the electrode connection connects the electrode of the first stack structure to the electrode of the second stack structure, and the electrode connection runs across the second common source plug.

12. A three-dimensional semiconductor memory device, comprising:

a substrate;

a dielectric pattern in the substrate;

a stack structure on the substrate, the stack structure including a plurality of insulation layers and a plurality of electrodes alternately stacked on the substrate;

a plurality of vertical channel structures penetrating the stack structure;

a first common source plug between the plurality of vertical channel structures, the first common source plug being connected to the substrate;

a plurality of contact plugs connected to the plurality of electrodes; and a second common source plug, the second common source plug insulated from the first common source plug and between the plurality of contact plugs, the second common source plug being spaced apart from the substrate across the dielectric pattern.

13. The three-dimensional semiconductor memory device of claim 12, wherein each of the first common source plug and the second common source plug has a plate shape running across the stack structure.

14. The three-dimensional semiconductor memory device of claim 12, further comprising:

a bit line connecting the plurality of vertical channel structures to each other, wherein the first common source plug is located below the bit line.

15. The three-dimensional semiconductor memory device of claim 12, further comprising:

a vertical dielectric structure between the first common source plug and the second common source plug, wherein a top surface of the vertical dielectric structure is located at a level higher than a top surfaces of the first common source plug and a top surface of the second common source plug, and a bottom surface of the vertical dielectric structure is located at a level lower than a level of a bottom surface of the first common source plug and the second common source plug.

16. The three-dimensional semiconductor memory device of claim 12, wherein a bottom surface of the second common source plug is located at a level lower than a bottom surface of the first common source plug.

17. The three-dimensional semiconductor memory device of claim 12, further comprising:

a dielectric spacer on a lateral surface of the second common source plug and a bottom surface of the second common source plug.

18. A three-dimensional semiconductor memory device, comprising:

a substrate including a cell array region and a connection region, the substrate having a trench on the connection region;

a dielectric pattern filling the trench;

a stack structure on the cell array region and the connection region, the stack structure including a plurality of insulation layers and a plurality of electrodes alternately stacked;

a vertical channel structure on the cell array region of the substrate, the vertical channel structure penetrating the stack structure on the cell array region and being connected to the substrate;

a contact plug on the connection region, the contact plug being connected to the connection region of the substrate;

a first common source plug on the cell array region of the substrate, the first common source plug on a side of the stack structure; and a second common source plug on the connection region, the second common source plug on a side of the stack structure, wherein the first common source plug is connected to the substrate, and the second common source plug is spaced apart from the substrate across the dielectric pattern.

19. The three-dimensional semiconductor memory device of claim 18, wherein, on a lateral surface of the stack structure, the first common source plug and the second common source plug extend in a direction parallel to a top surface of the substrate.

20. The three-dimensional semiconductor memory device of claim 18, further comprising:

a vertical dielectric structure between the first common source plug and the second common source plug, wherein wherein, on a lateral surface of the stack structure, the vertical dielectric structure extends in a direction perpendicular to a top surface of the substrate.

* * * * *